(12) United States Patent
Lee et al.

(10) Patent No.: US 11,817,362 B2
(45) Date of Patent: Nov. 14, 2023

(54) ELECTRONIC APPARATUS

(71) Applicant: Advanced Semiconductor Engineering, Inc., Kaohsiung (TW)

(72) Inventors: Pang Yuan Lee, Kaohsiung (TW); Kuei-Hao Tseng, Kaohsiung (TW); Chih Lung Lin, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 113 days.

(21) Appl. No.: 17/374,748

(22) Filed: Jul. 13, 2021

(65) Prior Publication Data
US 2023/0017424 A1    Jan. 19, 2023

(51) Int. Cl.
*H01L 23/31* (2006.01)
*H01L 23/528* (2006.01)
*H01L 21/768* (2006.01)

(52) U.S. Cl.
CPC .... *H01L 23/3178* (2013.01); *H01L 21/76898* (2013.01); *H01L 23/3114* (2013.01); *H01L 23/528* (2013.01); *H01L 2225/06513* (2013.01); *H01L 2924/151* (2013.01)

(58) Field of Classification Search
CPC ............... H01L 23/3178; H01L 23/528; H01L 23/3114; H01L 21/0207; H01L 27/14636; H01L 21/563; H01L 2924/15411; H01L 2225/06513; H01L 2924/18161
See application file for complete search history.

(56) References Cited

U.S. PATENT DOCUMENTS

| | | | |
|---|---|---|---|
| 6,388,207 B1 * | 5/2002 | Figueroa ................ | H05K 1/115 |
| | | | 257/E23.079 |
| 2002/0039464 A1 * | 4/2002 | Yoshimura .............. | H01L 24/24 |
| | | | 257/E25.032 |
| 2012/0062439 A1 * | 3/2012 | Liao ........................ | H01L 25/16 |
| | | | 29/25.01 |
| 2018/0006416 A1 * | 1/2018 | Lloyd .................... | H01R 24/60 |
| 2018/0315719 A1 * | 11/2018 | Kim .................. | H01L 23/49827 |
| 2020/0211996 A1 * | 7/2020 | Nakano .................... | H01L 24/83 |
| 2021/0193519 A1 * | 6/2021 | Aleksov ............ | H01L 21/76898 |
| 2022/0399277 A1 * | 12/2022 | Elsherbini ............... | H01L 25/50 |

* cited by examiner

*Primary Examiner* — Galina G Yushina
(74) *Attorney, Agent, or Firm* — FOLEY & LARDNER LLP

(57) ABSTRACT

The present disclosure provides an electronic apparatus including a first surface, a second surface, a third surface, a plurality of conductive elements, and an encapsulant. The second surface is nonparallel to the first surface. The third surface is distinct from the first surface and the second surface. The plurality of conductive elements are exposed from the second surface. The encapsulant covers the third surface and exposes the first surface and the second surface.

9 Claims, 22 Drawing Sheets

ELECTRONIC APPARATUS

BACKGROUND

1. Technical Field

The present disclosure relates to an electronic apparatus.

2. Description of the Related Art

As technology advances, various circuits or modules can be integrated into a package (such as a wearable device package or electronic device package) to provide additional functionalities. Electrical interconnection or signal transmission can be obtained through interconnected structures, such as flexible print circuits (FPCs) or flexible foils.

SUMMARY

In some arrangements, an electronic apparatus includes a first surface, a second surface, a third surface, a plurality of conductive elements, and an encapsulant. The second surface is nonparallel to the first surface. The third surface is distinct from the first surface and the second surface. The plurality of conductive elements are exposed from the second surface. The encapsulant covers the third surface and exposes the first surface and the second surface.

BRIEF DESCRIPTION OF THE DRAWINGS

Aspects of some arrangements of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
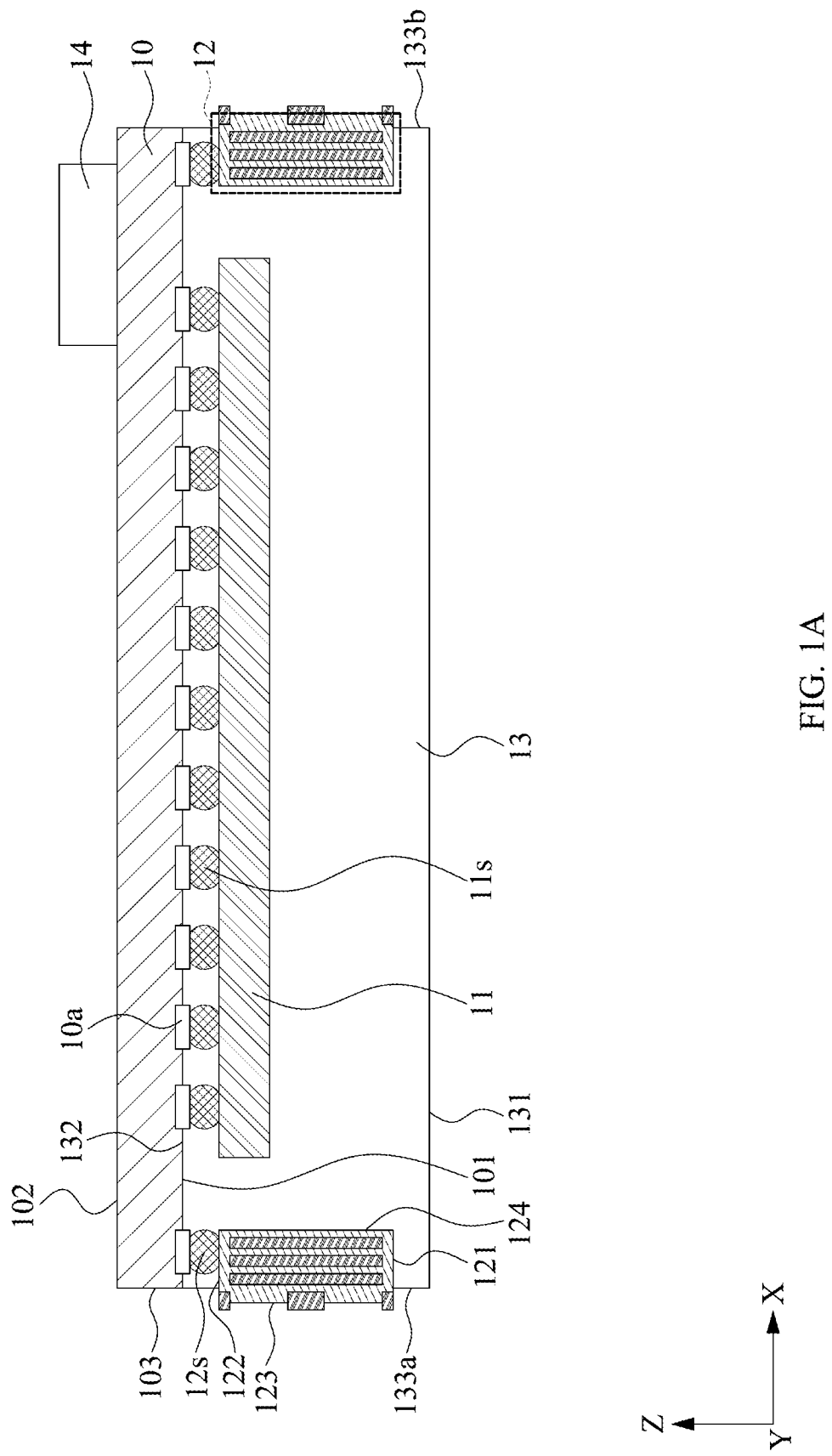
FIG. 1A is a cross-sectional view of a semiconductor device package in accordance with some arrangements of the present disclosure.

The following disclosure provides different arrangements, or examples, for implementing different features of the provided subject matter. Specific examples of components and arrangements are described as follows to explain certain aspects of the present disclosure. These are, of course, merely examples and are not intended to be limiting. For example, the formation of a first feature over or on a second feature in the description that follows may include arrangements in which the first and second features are formed or disposed in direct contact, and may also include arrangements in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various arrangements and/or configurations discussed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of arrangements of this disclosure are not deviated from by such arrangement.

The following description involves an electronic apparatus. The arrangements disclosed herein relate to providing flexibility in electrical interconnections and signal transmissions.

FIG. 1A is a cross-sectional view of a semiconductor device package 1 in accordance with some arrangements of the present disclosure.

In some arrangements, the semiconductor device package 1 may be a single module. For example, the semiconductor device package 1 may be an entire central processing unit (CPU) in one contained package. For example, the semiconductor device package 1 may integrate digital and analog functions on a single board. In some arrangements, the semiconductor device package 1 may include a system on module (SOM). In some arrangements, the semiconductor device package 1 may be a part of an electronic apparatus (such as the electronic apparatus in FIG. 7). In some arrangements, as shown in FIG. 1A, the semiconductor device package 1 may include a substrate 10, an electronic device 11, an interconnection structure 12, a protection layer (or a protection material or an encapsulant) 13, and a connecting module 14.

In some arrangements, the substrate 10 may include, for example, a printed circuit board (PCB) (such as a paper-based copper foil laminate), a composite copper foil laminate, a polymer-impregnated glass-fiber-based copper foil laminate, or so on. The substrate 10 may have a surface 101, a surface 102 opposite to the surface 101, and a surface 103 (which can also be referred to as a lateral surface of the substrate 10) extending between the surface 101 and the surface 102. As shown, the surfaces 101 and 102 extend along or parallel to the X direction (or the first direction), and the surface 103 extends along or parallel to the Z direction (or the third direction). The surface 101 may be an active surface. The substrate 10 may include a redistribution layer (RDL), a grounding element, or other conductive structures. The conductive structures may include, for example, one or more conductive pads 10a proximate to, adjacent to, embedded in, and/or exposed from the surface 101 of the substrate 10.

In some arrangements, the electronic device 11 (or an electronic component) may be disposed on the surface 101 of the substrate 10. In some arrangements, the electronic device 11 may be an active component, such as an integrated circuit (IC) chip or a die. In some arrangements, the electronic device 11 may be a passive electrical component, such as a capacitor, resistor, inductor, or so on. The electronic device 11 may be electrically connected to the substrate 10 by, for example, flip-chip (such as through a solder bump 11s), wire-bonding, or so on. In some arrangements, the electronic device 11 may be disposed on the surface 102 of the substrate 10. The positions and numbers of electronic devices in the semiconductor device package 1 are not intended to limit the present disclosure. For example, there may be any number of electronic devices disposed on the surface 101 or the surface 102 due to design requirements, where such electronic devices can be connected or operatively coupled to the surface 101 or the surface 102 in the manner in which the electronic device 11 is connected or operatively coupled to the surface 101 or the surface 102. In some arrangements, the electronic device 11 may be omitted.

In some arrangements, the interconnection structure 12 may be disposed on or adjacent to the surface 101 of the substrate 10. The surface 101 is closer to interconnection structure 12 than the surface 102. As shown, the interconnection structure 12 may be spaced apart from the electronic device 11 by the substrate 10 in some examples. In some arrangements, the interconnection structure 12 may be disposed on or adjacent to the periphery of the surface 101 of the substrate 10. For example, the interconnection structure 12 may be disposed adjacent to the lateral surface 103 of the substrate 10. As shown, an interconnection structure 12 can be disposed adjacent to one lateral surface 103, and another interconnection structure 12 can be disposed adjacent to an opposite lateral surface 103. In some arrangements, the interconnection structure 12 may be configured to be electrically connected with the electronic device 11 through the substrate 10. In some arrangements, the interconnection structure 12 may be electrically connected to the substrate 10 by a connector 12s. In some arrangements, the connector 12s may include a soldering material, such as a solder bump, or another suitable conductive element. The interconnection structure 12 may be configured to provide input/output (I/O) pads or I/O pins for electrical interconnection or signal transmission between the semiconductor package device 1 and external components (e.g. external circuits or circuit boards).

In some arrangements, the interconnection structure 12 may include a conductive pillar, an interposer, a build-up circuit, a metal frame (such as the metal frame 60 illustrated in FIG. 6), other elements for transmit electrical signals, or a combination thereof. In some arrangements, the interconnection structure 12 may include a PCB, such as a paper-based copper foil laminate, a composite copper foil laminate, a polymer-impregnated glass-fiber-based copper foil laminate, or so on. In some arrangements, the interconnection structure 12 may include silicon (Si), glass, polyimide, FR4, or another suitable material. In some arrangements, the interconnection structure 12 may include circuitry or conductive elements, such as a conductive pad, a conductive layer, and/or a conductive via.

In some arrangements, the interconnection structure 12 (such as one or more conductive elements thereof) may be at least partially exposed from a surface (or an imaginary plane) angled (e.g., nonparallel) with respect to the surface 101 of the substrate 10. A normal vector of the surface 101 is parallel with the Z-axis.

For example, the interconnection structure 12 may be at least partially exposed from lateral surfaces or edges (such as surfaces 133a and 133b) of the protection layer 13. The surfaces 133a and 133b are angled (e.g., nonparallel) with the surface 101 and the surface 102. In some arrangements, the surface (or an imaginary plane) of the protection layer 13 exposing the interconnection structure 12 and the surface 101 and/or 102 of the substrate 10 are at an angle less than 180°. For example, as shown, the surface (or an imaginary plane) of the protection layer 13 exposing the interconnection structure 12 may be substantially perpendicular to the surface 101 and/or 102 of the substrate 10.

For example, through the interconnection structure 12, the semiconductor package structure 1 may be electrically connected with an external component in an orientation that is angled (e.g., nonparallel) with respect to the Z-axis (or the third direction) when the semiconductor package structure 1 and the external component are operatively coupled or connected. For example, through the interconnection structure 12, the semiconductor package structure 1 may be electrically connected with one or more external components along or facing a direction along the X-axis (or the first direction), the Y-axis (or the second direction), and/or other orientations angled (nonparallel) with respect to the Z-axis, such as defining an angle less than 180° with the Z-axis or an orientation substantially perpendicular to the Z-axis. In some examples, an external component is configured to face a surface (e.g., the surface 133a or 133b) of the semiconductor package structure 1 on which the interconnection structure 12 is located, when the external component is connected, attached, or otherwise operatively coupled to the semiconductor package structure 1.

Two interconnection structures are illustrated in a cross-sectional view of FIG. 1A. However, the number and the position of interconnection structures in the semiconductor device package 1 shown in FIG. 1A are not intended to limit the present disclosure and may be adjusted based on design requirements. For example, an interconnection structure can be between the semiconductor device package 1 and any number of external components having various functions. The interconnection structure may be provided on any surface (or an imaginary plane) angled with respect to the surface 101 of the substrate 10, and is not limited to the surfaces 133a and 133b of the protection layer 13.

In some arrangements, the semiconductor device package 1 may have a surface (such as the surface 101 or the surface 102) on which electronic devices or components are configured to be mounted, and the other surfaces (such as the surface 131, the surface 133a, the surface 133b, and the other lateral surfaces or edges of the protection layer 13) may be configured to provide I/O pads or I/O pins. In some arrangements, the density (such as the I/O density) of the conductive pads 10a (or conductive elements) on the substrate 10 may be different from the density (such as the I/O density) of the conductive elements on the surface 131, the surface 133a, the surface 133b, and/or the other lateral surfaces or edges of the protection layer 13.

Figure 7:
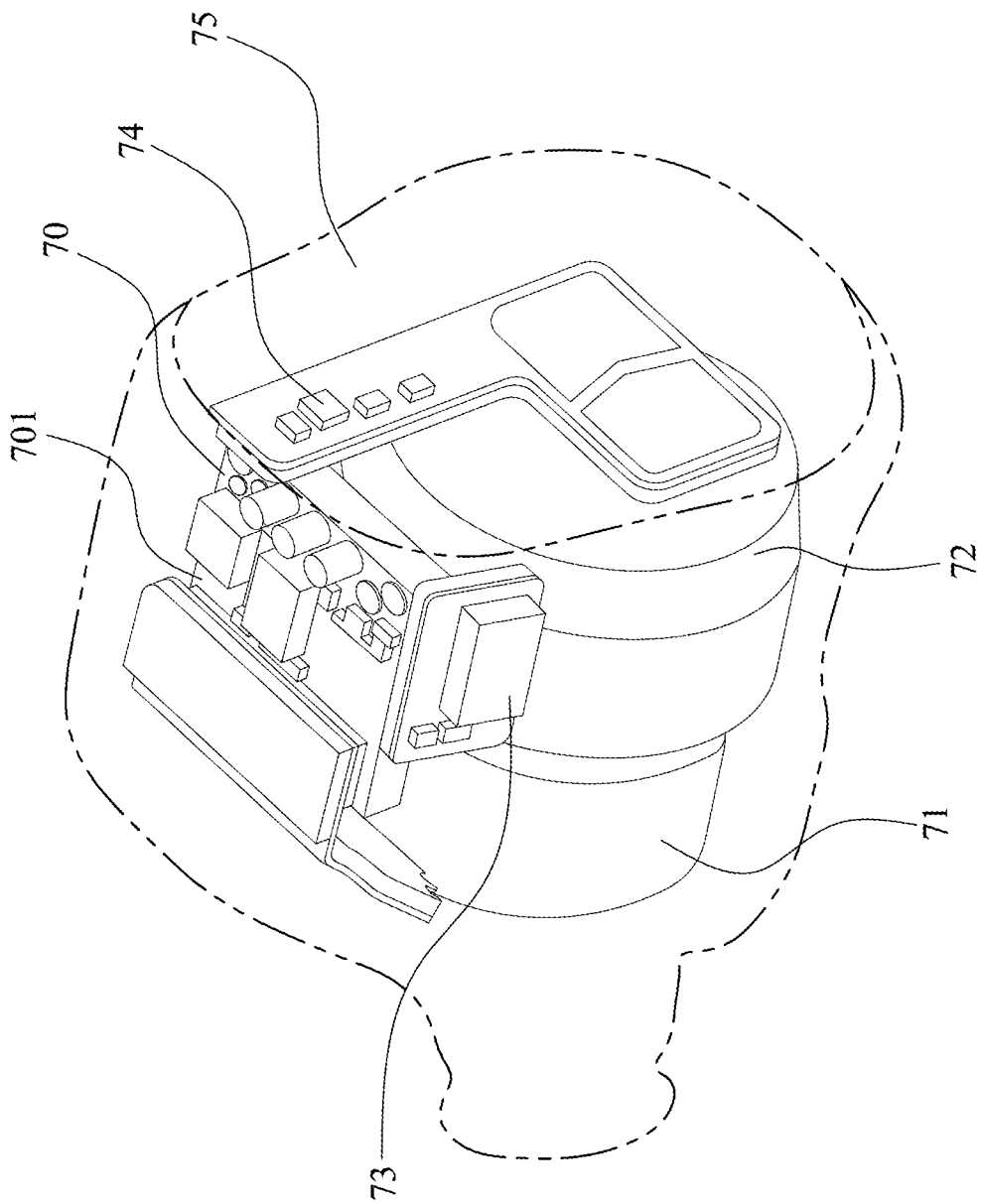
FIG. 7 is a perspective view of an electronic apparatus in accordance with some arrangements of the present disclosure.

Therefore, the semiconductor device package 1 may be connected with external components along any orientation. The layout design flexibility of the semiconductor package device 1 can be increased, which would in turn improve the electrical performance and reliability of the semiconductor package device 1. For example, the interconnection structures may be provided on any surface to connect to an external component in any orientation to provide a stable electrical connection. The semiconductor package device 1 may have standard I/O capability that can be ready-to-use in a carrier board (CB) or in a system design. For example, in some arrangements, the semiconductor device package 1 may be configured to be connected to an electronic device, such as an earpiece (as shown in FIG. 7), an electronic watch, electronic glasses, an electronic wristband, other electronic devices, or other wearable devices.

In some arrangements, the interconnection structure 12 may be configured to be electrically connected with the electronic device 11 through the substrate 10. In some arrangements, the interconnection structure 12 may be configured to provide a signal transmission path for transmitting analog signal, digital signal, or both. In some arrangements, the signal transmission path from the interconnection structure 12 to the electronic device 11 includes at least two non-parallel signal transmission directions. For example, the signal transmission direction may include a first direction, a second direction, a third direction, and/or fourth direction.

The first direction may be substantially perpendicular to a surface 123 of the interconnection structure 12. The first direction may pass through the interconnection structure 12 from the surface 123 to the opposite surface 124. The second direction may be substantially perpendicular to the surface 101 of the substrate 10. The second direction may pass through the substrate 10 from the surface 101 to the opposite surface 102. The third direction may be substantially parallel to the surface 101 of the substrate 10. The fourth direction may pass through the substrate 10 from the surface 102 to the opposite surface 101.

The protection layer 13 may be disposed on the surface 101 of the substrate 10. The protection layer 13 may cover or encapsulate the electronic device 11. The protection layer 13 may partially cover or encapsulate the interconnection structure 12. In other words, the interconnection structure 12 may be at least partially exposed from the protection layer 13, for connecting with the external component. For example, the protection layer 13 may have a surface 131 facing away from the substrate 10, a surface 132 opposite to the surface 131, and a plurality of lateral surfaces or edges (such as surfaces 133a and 133b) extending between the surface 131 and the surface 132. The surface 132 may contact a surface of the substrate 10. The interconnection structure 12 may be at least partially exposed from the lateral surfaces or edges (such as the surface 133a and/or the 133b) of the protection layer 13. For example, as stated, the one or more conductive elements may be at least partially exposed from the lateral surfaces or edges (such as the surface 133a and/or the 133b) of the protection layer 13.

In some arrangements, the protection layer 13 may include an encapsulant. In some arrangements, the protection layer 13 may include an epoxy resin having fillers, a molding compound (e.g., an epoxy molding compound or other molding compound), a polyimide, a phenolic compound or material, a material with a silicone dispersed therein, or a combination thereof. In some arrangements, the protection layer 13 may be configured to protect the interconnection structure 12, to increase the stability of the interconnection structure 12, to protect the interconnection structure 12 from contamination, moisture, or oxidization. In some arrangements, the protection layer 13 may be omitted.

The connecting module 14 (or a component) may be disposed on the surface 102 of the substrate 10. The connecting module 14 may be spaced apart from the protection layer 13 by the substrate 10. In some arrangements, the connecting module 14 may include soldering material on a conductive pad. In some arrangements, the connecting module 14 may include other types of connecting elements, such as a conductive pillar, a conductive frame, a conductive wire, or other. In some arrangements, the connecting module 14 may be electrically connected with pads or ports exposed from the surface 102. In some arrangements, the pads or ports exposed from the surface 102 may be connected with other active or passive components mounted on the surface 102.

The connecting module 14 may be configured to provide electrical interconnection and/or signal transmission between the semiconductor package device 1 and external components (e.g. external circuits or circuit boards). In some arrangements, the connecting module 14 and the interconnection structure 12 may be configured to provide different functions. For example, the connecting module 14 and the interconnection structure 12 may be configured to transmit signals of different specification or characteristic such as different voltage values or current values, or signals from different sources. For example, the connecting module 14 and the interconnection structure 12 may be configured to transmit signals of different data rates, bandwidths, frequencies, or the combinations thereof.

In some arrangements, the connecting module 14 may be configured to be electrically connected with the electronic device 11 through the substrate 10. In some arrangements, the connecting module 14 may be configured to provide a signal transmission path for transmitting analog signal, digital signal, or both.

In some arrangements, the connecting module 14 and the interconnection structure 12 may be configured to provide electrical interconnection or signal transmission along multiple orientations. For example, the connecting module 14 may be connected to the rest of the semiconductor device package 1 (e.g., to the surface 102 of the substrate 10) along or parallel to the Z-axis and the interconnection structure 12 may be connected to the rest of the semiconductor device package 1 along or parallel to the X-axis and/or the Y-axis.

In some arrangements, given that the interconnection structure 12 may be provided on any surface to provide I/O pads or I/O pins, I/O quantity and dimensions of the connecting module 14 can be reduced to accommodate more electronic devices (such as the electronic device 11). In addition, the size of the semiconductor package device 1 may be reduced and costs reduced accordingly.

Figure 1B:
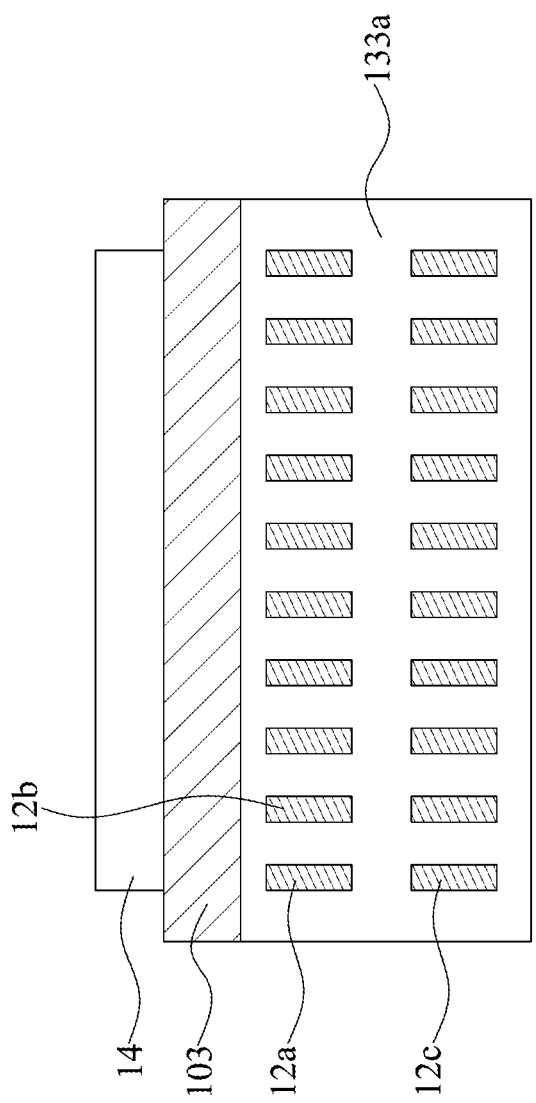
FIG. 1B is a cross-sectional view of a semiconductor device package in accordance with some arrangements of the present disclosure.
Figure 1B:
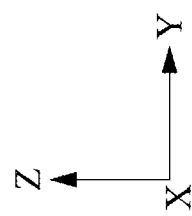

FIG. 1B is a cross-sectional view of a semiconductor device package in accordance with some arrangements of the present disclosure. In some arrangements, the semiconductor device package 1 in FIG. 1A may have a cross sectional view as shown in FIG. 1B.

As shown in FIG. 1B, two rows of conductive elements are disposed on the surface 133a of the protection layer 13. For example, the conductive elements on the surface 133a are arranged along or parallel to two orientations, i.e., along or parallel to the Y and Z-axes. For example, the conductive element 12a and the conductive element 12b (as well as other conductive elements) can be arranged along or parallel to the Y-axis. The conductive element 12a and the conductive element 12c can be arranged along or parallel to the Z-axis.

In some arrangements, as stated, the two rows of conductive elements may be parts of the interconnection structure 12 in FIG. 1A and may be exposed from the protection layer 13 to function as I/O pads of the semiconductor device package 1, to connect with the external device. For example, in an example process for manufacturing the semiconductor device package 1 in FIG. 1A, the interconnection structure 12 may be covered by the protection layer 13, then a part of the protection layer 13 may be removed (by, for example, laser) from the lateral surfaces (such as the surface 133a) to expose the conductive elements (e.g., the conductive elements 12a, 12b, and 12c). It is to be noted that some materials (such as Si, glass, polyimide, FR4) of the interconnection structure 12 may not be removed by the above-referenced method and remain on the surface 133a of the protection layer 13. For example, some materials (such as Si, glass, polyimide, FR4) of the interconnection structure 12 may surround the conductive elements.

Therefore, dimension and pitch (such as the line/space (L/S) widths), location, shape, pattern, and number of the I/O pads may be defined by the protection layer 13.

In some arrangements, the spacing between adjacent conductive elements (such as the pitch of conductive elements) may be fixed or identical to increase temperature uniformity of the conductive elements, and alleviate or cancel oxidization of the conductive elements that may occur during manufacture.

In some arrangements, more rows or columns of conductive elements may be provided on the surface 133a of the protection layer 13 to increase the I/O quantity and to increase the data rate.

In some arrangements, parasite capacitance due to the manufacturing process, component position, component dimension, material characteristic, or other, may be alleviated or cancelled out by I/O with fine pitch. As shown in FIG. 1B, each of the conductive elements has an elongated shape with a longitudinal dimension or length (e.g., the vertical dimension along or parallel to the Z-axis) and a latitudinal dimension or length (e.g., the horizontal dimension along or parallel to the Y-axis). The longitudinal dimension is greater than the latitudinal dimension.

The specific details of conductive elements illustrated in and described with respect to FIGS. 1B-1F are not intended to limit the present disclosure, and may be adjusted due to design requirements as stated. In addition, although the surface 133a of the protection layer 13 is illustrated in FIGS. 1B-1F, the other surfaces (such as the surface 131, the surface 133b, and the other lateral surfaces or edges of the protection layer 13) may have similar or the same configurations and are not repeated hereafter.

Figure 1C:
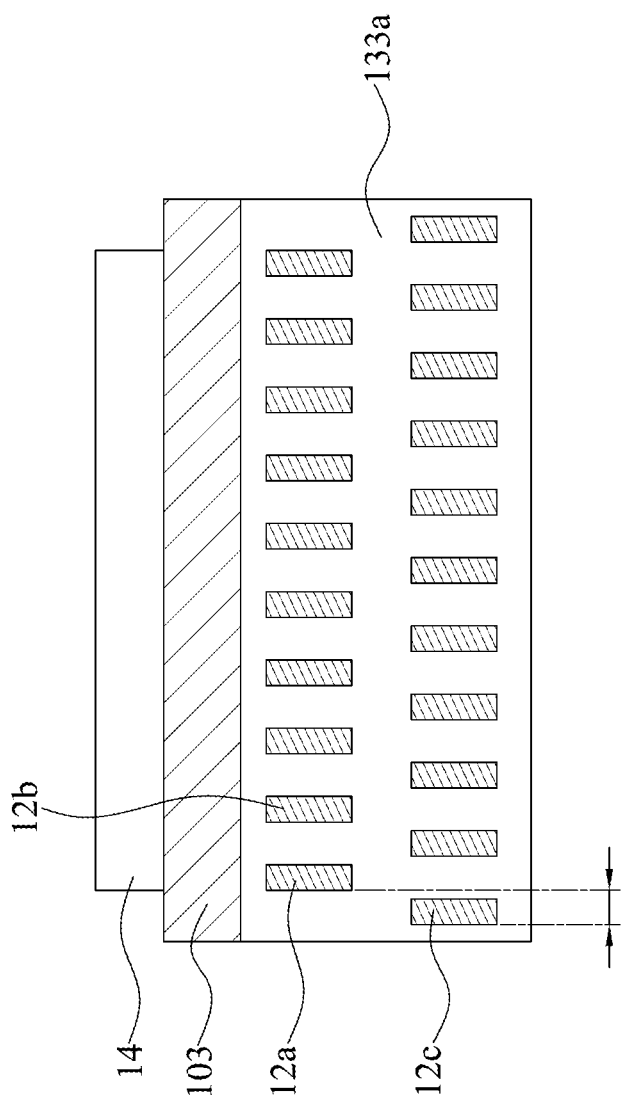
FIG. 1C is a cross-sectional view of a semiconductor device package in accordance with some arrangements of the present disclosure.
Figure 1C:
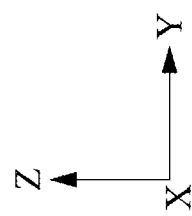

FIG. 1C is a cross-sectional view of a semiconductor device package in accordance with some arrangements of the present disclosure. In some arrangements, the semiconductor device package 1 in FIG. 1A may have a cross sectional view as shown in FIG. 1C. The cross-sectional view in FIG. 1C is similar to the cross-sectional view in FIG. 1B other than the differences described as follows. As shown in FIG. 1C, each of the conductive elements has an elongated shape with a longitudinal dimension or length (e.g., the vertical dimension along or parallel to the Z-axis) and a latitudinal dimension or length (e.g., the horizontal dimension along or parallel to the Y-axis). The longitudinal dimension is greater than the latitudinal dimension.

As shown in FIG. 1C, two rows of conductive elements are staggered. For example, the conductive element 12a and the conductive element 12c are not aligned along or parallel to the Z-axis. In other arrangements, the pattern of the conductive elements may be irregular.

Figure 1D:
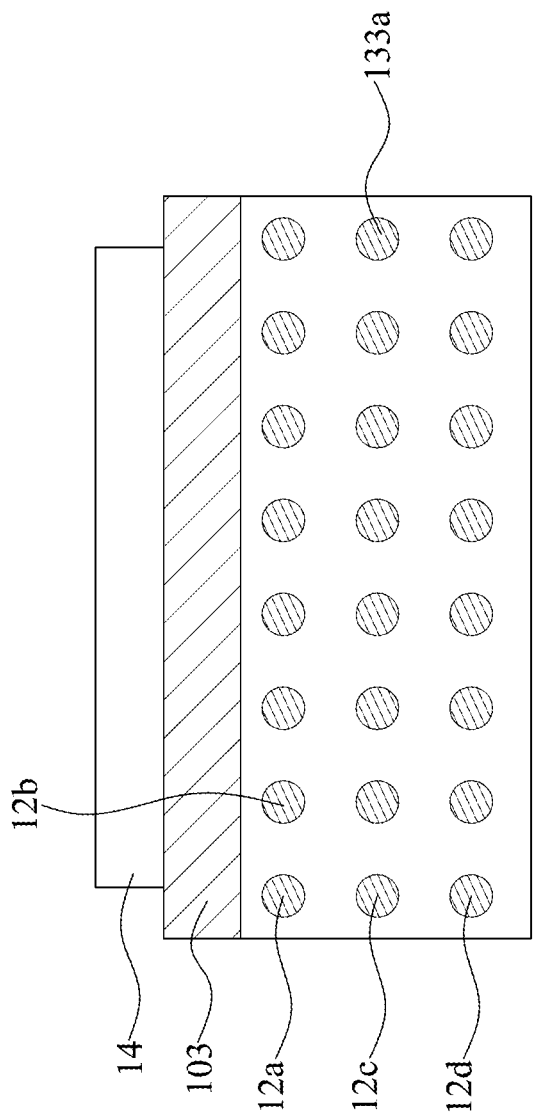
FIG. 1D is a cross-sectional view of a semiconductor device package in accordance with some arrangements of the present disclosure.

FIG. 1D is a cross-sectional view of a semiconductor device package in accordance with some arrangements of the present disclosure. In some arrangements, the semiconductor device package 1 in FIG. 1A may have a cross sectional view as shown in FIG. 1D. The cross-sectional view in FIG. 1D is similar to the cross-sectional view in FIG. 1B other than the differences described as follows.

As shown in FIG. 1D, three rows of conductive elements are disposed on the surface 133a of the protection layer 13. For example, the conductive element 12a and the conductive element 12b can be arranged along or parallel to the Y-axis, and conductive element 12a, conductive element 12c, and conductive element 12d along or parallel to the Z-axis. The conductive elements (including the conductive elements 12a, 12b, 12c, and 12d) may be circular, round, or another shape such as elliptical. In some arrangements, such arrangements of the conductive elements may help facilitate connection with a POGO pin. In some arrangements, the POGO pin may be configured to transmit a radio frequency (RF) signal to/from an antenna.

Figure 1E:
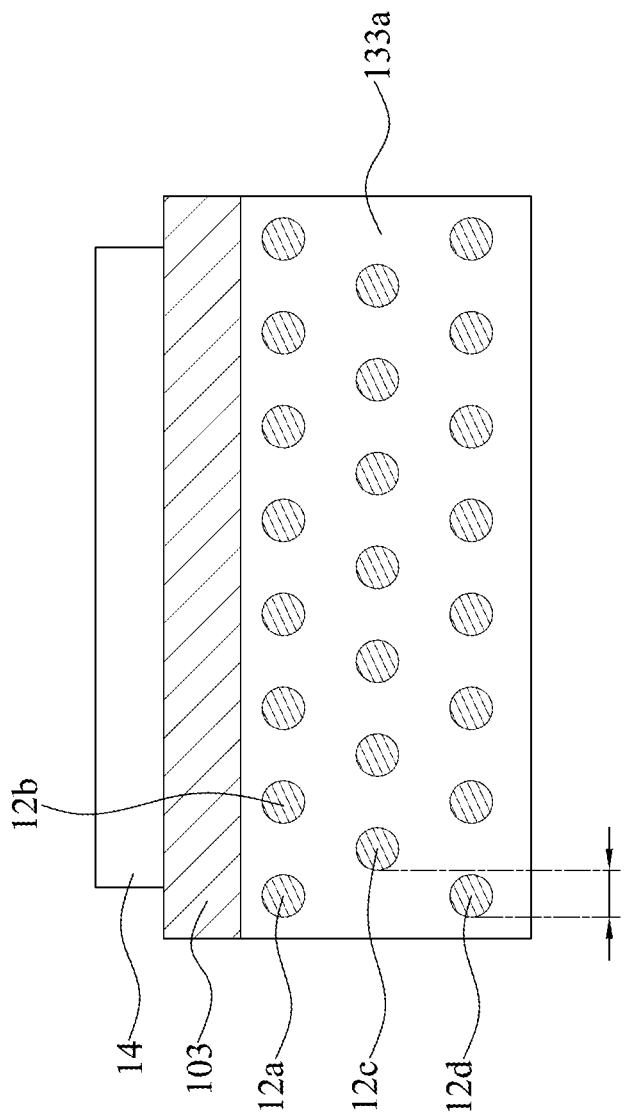
FIG. 1E is a cross-sectional view of a semiconductor device package in accordance with some arrangements of the present disclosure.

FIG. 1E is a cross-sectional view of a semiconductor device package in accordance with some arrangements of the present disclosure. In some arrangements, the semiconductor device package 1 in FIG. 1A may have a cross sectional view as shown in FIG. 1E. The cross-sectional view in FIG. 1E is similar to the cross-sectional view in FIG. 1B other than the differences described as follows.

As shown in FIG. 1E, two rows of conductive elements are staggered. For example, the conductive element 12a and the conductive element 12c may not be aligned along or parallel to the Z-axis. In some arrangements, the pattern of the conductive elements may be irregular.

Figure 1F:
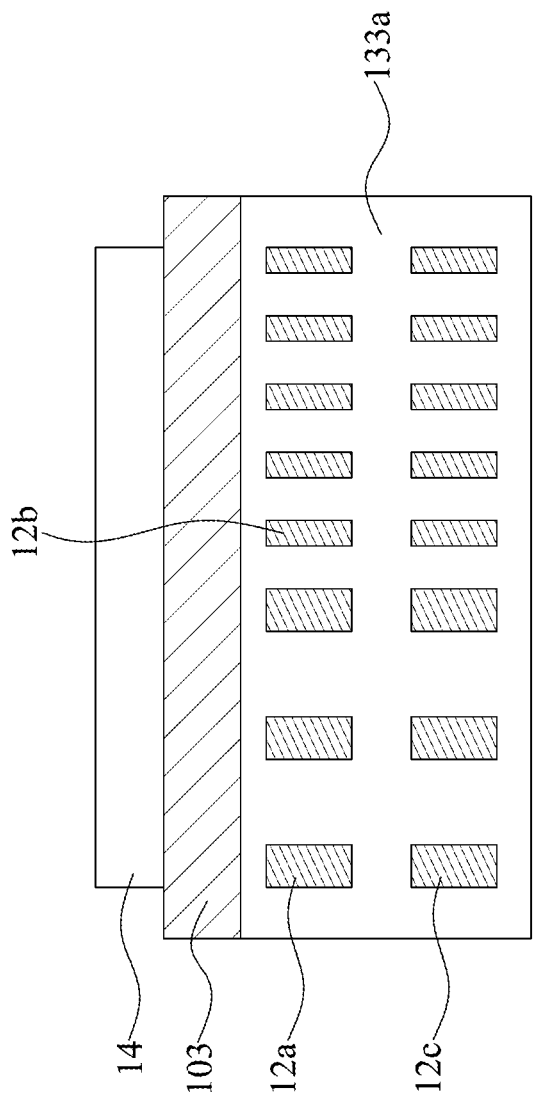
FIG. 1F is a cross-sectional view of a semiconductor device package in accordance with some arrangements of the present disclosure.
Figure 1F:
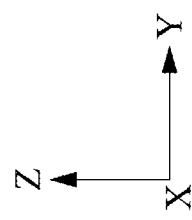

FIG. 1F is a cross-sectional view of a semiconductor device package in accordance with some arrangements of the present disclosure. In some arrangements, the semiconductor device package 1 in FIG. 1A may have a cross sectional view as shown in FIG. 1F. The cross-sectional view in FIG. 1F is similar to the cross-sectional view in FIG. 1B other than the differences described as follows.

As shown in FIG. 1F, conductive elements of different dimensions and or pitches are provided on the surface 133a of the protection layer 13. For example, the conductive elements of different L/S widths can be provided on the surface 133a of the protection layer 13. For example, the L/S width of the conductive element 12a may exceed the L/S width of the conductive element 12b. As shown in FIG. 1F, each of the conductive elements has an elongated shape with a longitudinal dimension or length (e.g., the vertical dimension along or parallel to the Z-axis) and a latitudinal dimension or length (e.g., the horizontal dimension along or parallel to the Y-axis). The longitudinal dimension is greater than the latitudinal dimension.

In some arrangements, the conductive element 12a and the conductive element 12b may be configured to provide different functions, such as transmission of signals of different specification or characteristic such as voltage or current values. For example, the conductive element 12a and the conductive element 12b may be configured to transmit signals of different data rates, bandwidths, frequencies, or combinations thereof.

For example, the conductive element 12a may have a pitch exceeding that of the conductive element 12b. For example, the I/O density of the conductive element 12a may be less than the I/O density of the conductive element 12b. For example, the conductive element 12a may be configured to transmit RF or sensing signals, or enable high-speed data transmission. The conductive element 12b may be configured to provide power.

Figure 1G:
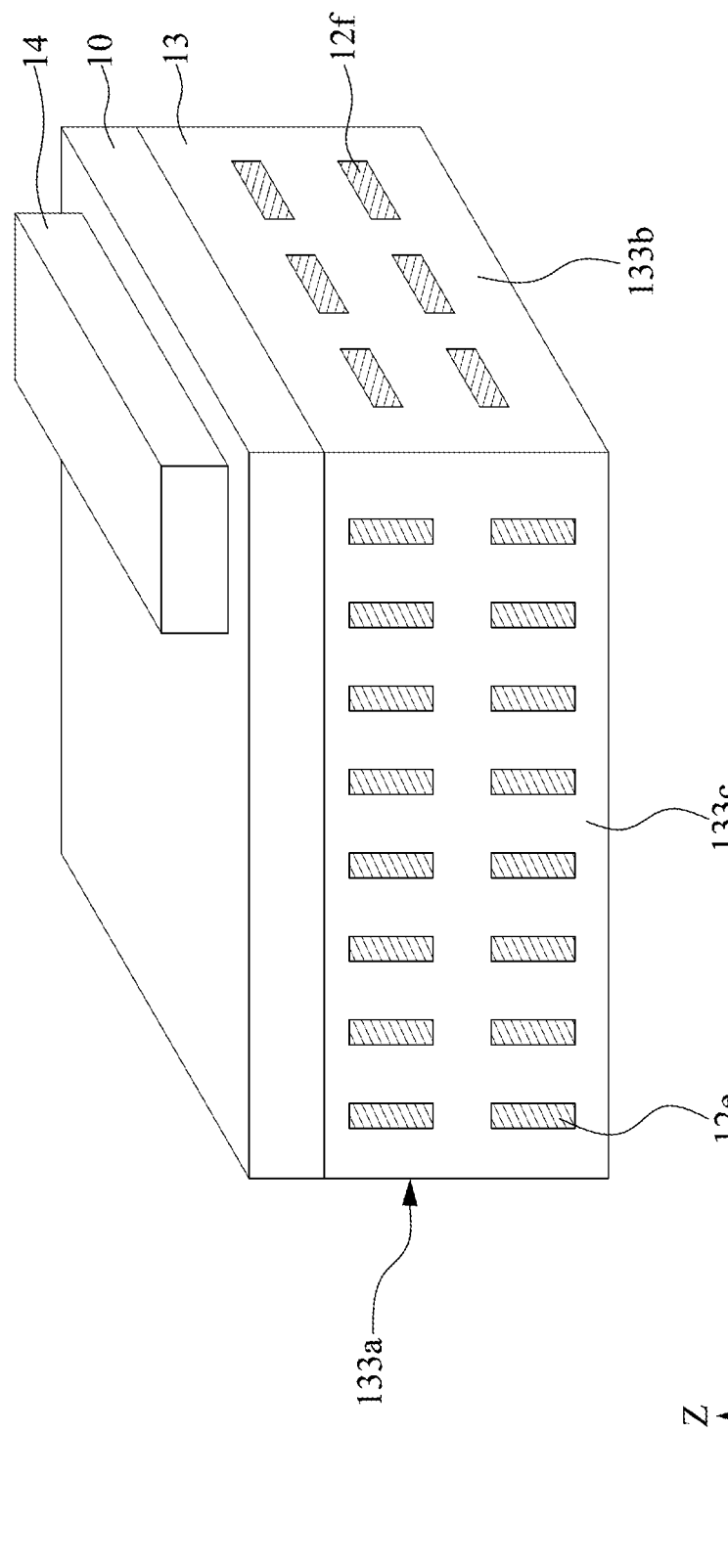
FIG. 1G is a perspective view of a semiconductor device package in accordance with some arrangements of the present disclosure.

FIG. 1G is a perspective view of a semiconductor device package in accordance with some arrangements of the present disclosure. In some arrangements, the semiconductor device package 1 in FIG. 1A may have a perspective view as shown in FIG. 1G.

As shown in FIG. 1G, the protection layer 13 has a plurality of lateral surfaces or edges, such as surfaces 133a, 133b, and 133c. Each of the surfaces 133a, 133b, and 133c may be angled (e.g., nonparallel) with respect to the surface 101 of the substrate 10. The surface 133a may be opposite to the surfaces 133b. The surface 133c may be adjacent to the surface 133a and the surface 133b.

Two rows of conductive elements (including the conductive element 12e) are disposed on the surface 133c of the protection layer 13. As shown in FIG. 1G, each of the conductive elements located on the surface 133c has an elongated shape with a longitudinal dimension or length (e.g., the vertical dimension along or parallel to the Z-axis) and a latitudinal dimension or length (e.g., the horizontal dimension along or parallel to the X-axis). The longitudinal dimension is greater than the latitudinal dimension. Two rows of conductive elements (including the conductive element 12f) are disposed on the surface 133b of the protection layer 13. As shown in FIG. 1G, each of the conductive elements located on the surface 133b has an elongated shape with a longitudinal dimension or length (e.g., the vertical dimension along or parallel to the Y-axis) and a latitudinal dimension or length (e.g., the horizontal dimension along or parallel to the Z-axis). The longitudinal dimension is greater than the latitudinal dimension. In addition, there may be one or more rows of conductive elements (not shown in FIG. 1G) disposed on the surface 133a of the protection layer 13.

In some arrangements, the conductive element 12e and the conductive element 12f may be configured to provide different functions. For example, the conductive element 12e and the conductive element 12f may be configured to transmit signals of different specification or characteristics such as voltage or current values. For example, the conductive element 12e and the conductive element 12f may be configured to transmit signals of different data rates, bandwidths, frequencies, or combinations thereof. As shown, the shape, orientation, and pitch of the conductive elements located on the surface 133c are different from the shape, orientation, and pitch of the conductive elements located on the surface 133b.

Figure 1H:
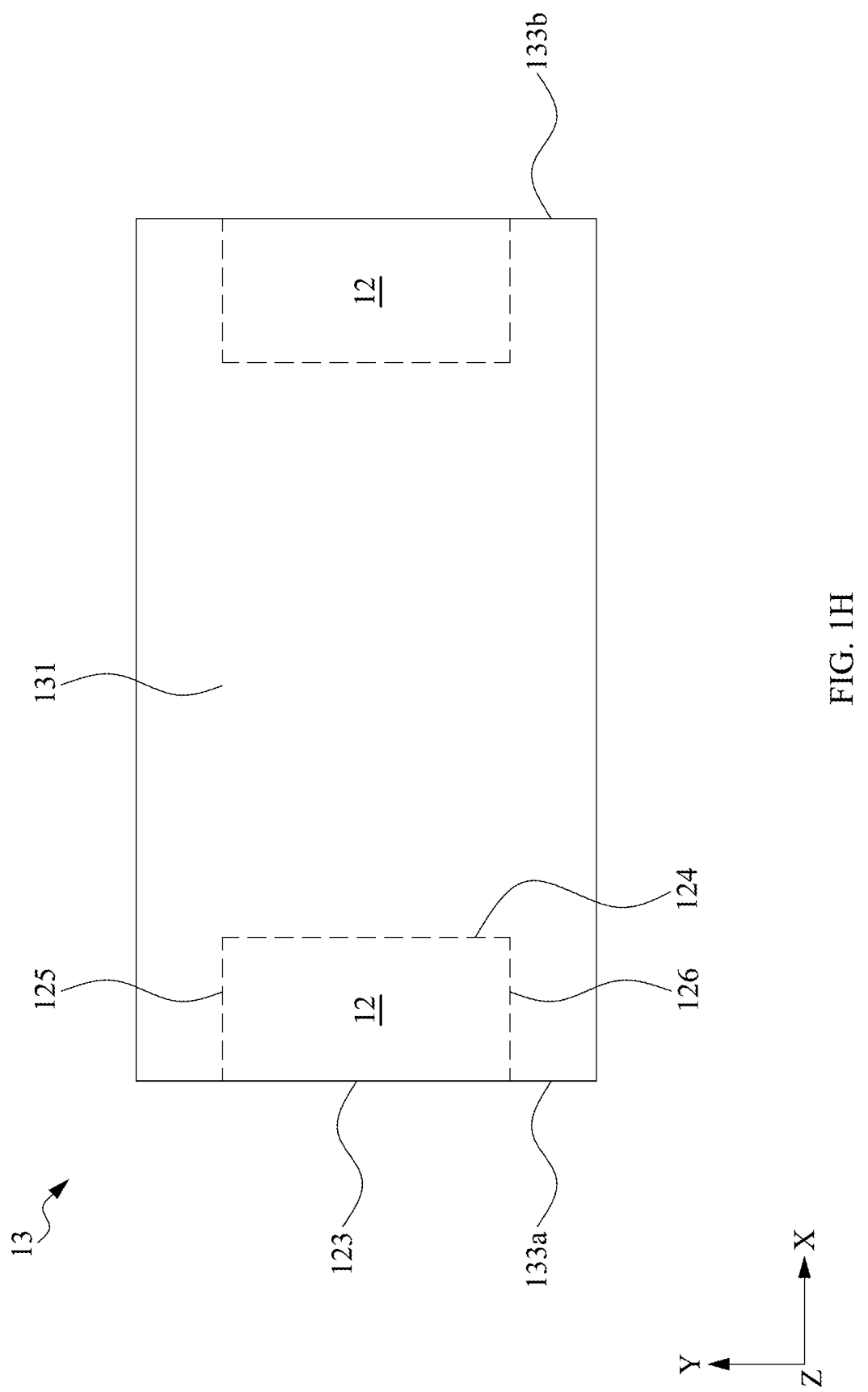
FIG. 1H is a bottom view of a semiconductor device package in accordance with some arrangements of the present disclosure.

FIG. 1H is a bottom view of the semiconductor device package 1 in accordance with some arrangements of the present disclosure.

Referring to FIG. 1A and FIG. 1H, the interconnection structure 12 may have a surface 122 facing to and parallel to the surface 101 of the substrate 10, and a surface 121 opposite to the surface 122. In some arrangements, the surface 122 may be covered by the protection layer 13. In some arrangements, the surface 121 may be covered by the protection layer 13.

The interconnection structure 12 may have a surface 123 at partially exposed from lateral surfaces or edges (such as surfaces 133a and 133b) of the protection layer 13. The surface 123 may be angled (e.g., nonparallel) with the surface 101 and the surface 102 of the substrate 10. The surface 123 may be extended between the surface 121 and the surface 122. In some arrangements, conductive elements may be disposed on the surface 123. In some arrangements, the interconnection structure 12 may have a dielectric layer that having the surface 123.

The interconnection structure 12 may have a surface 124 opposite to the surface 123. The surface 124 may be angled (e.g., nonparallel) with the surface 101 and the surface 102 of the substrate 10. The surface 124 may be extended between the surface 121 and the surface 122. In some arrangements, the surface 124 may be covered by the protection layer 13.

The interconnection structure 12 may have a surface 125 nonparallel to the surface 121, the surface 122, the surface 123, and the surface 124. The surface 125 may be angled (e.g., nonparallel) with the surface 101 and the surface 102 of the substrate 10. The surface 125 may be extended between the surface 121 and the surface 122. The surface 125 may be extended between the surface 123 and the surface 124. The interconnection structure 12 may have a surface 126 opposite to the surface 125. The surface 126 may be angled (e.g., nonparallel) with the surface 101 and the surface 102 of the substrate 10. The surface 126 may be extended between the surface 121 and the surface 122. The surface 126 may be extended between the surface 123 and the surface 124. In some arrangements, the surface 125 may be covered by the protection layer 13. In some arrangements, the surface 126 may be covered by the protection layer 13.

Figure 1I:
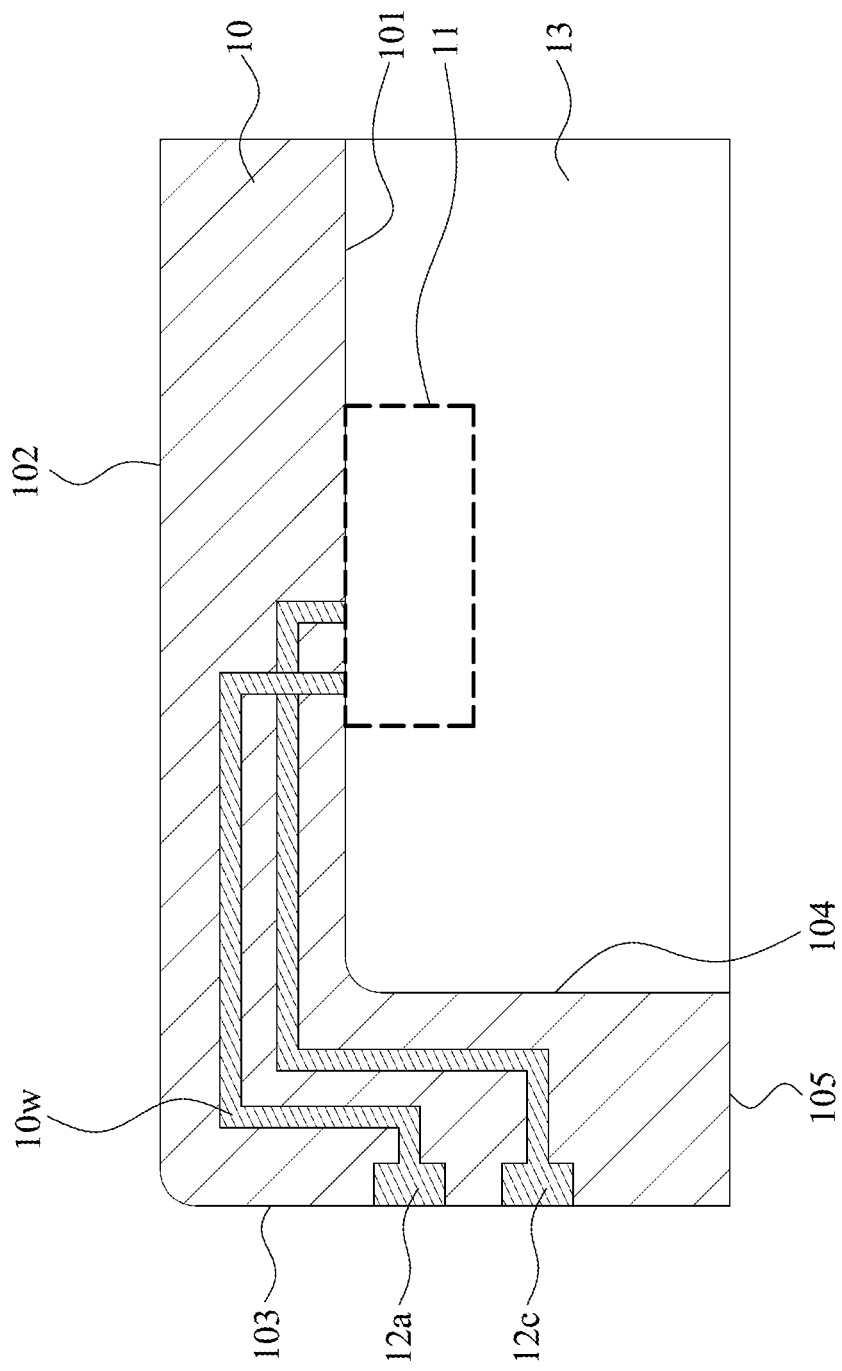
FIG. 1I is a cross-sectional view of a part of a semiconductor device package in accordance with some arrangements of the present disclosure.

FIG. 1I is a cross-sectional view of a part of a semiconductor device package in accordance with some arrangements of the present disclosure. The semiconductor device package in FIG. 1I is similar to the semiconductor device package 1 in FIG. 1A and the similar or the same components are annotated with the same symbols.

In some arrangements, the surface 102 and the surface 101 of the substrate 10 may be substantially parallel, and the surface 103 may be connected with the surface 102. The surface 103 may be non-parallel to the surface 101 and the surface 102. The substrate 10 may include a surface 104 opposite to the surface 103. The surface 104 may be non-parallel to the surface 101 and the surface 102. The surface 104 may be covered by the protection layer 13. The substrate 10 may include a surface 105 extending between the surface 103 and the surface 104. The surface 105 may be closer to the surface 101 than to the surface 102. In some arrangements, the substrate 10 may include a flexible print circuits (FPC). The substrate 10 may be bent such that the surface 103 of the substrate 10 may extend and exceed over the surface 101. The substrate 10 may be bent such that the surface 104 of the substrate 10 may extend from the surface 101 in a direction away from the surface 102. In some arrangements, conductive elements 10a and 10c may be disposed on the surface 103.

In some arrangements, the conductive elements 10a and 10c may be configured to be electrically connected with the electronic device 11 through the connection element 10w in the substrate 10. In some arrangements, the conductive elements 10a and 10c may be configured to provide a signal transmission path for transmitting analog signal, digital signal, or both.

For example, the conductive elements may be disposed on a portion (such as the surface 102) of the continuous surface that facing the first direction. For example, the conductive elements may be disposed on a portion (such as the surface 103) of the continuous surface that facing the second direction. In some arrangements, the substrate 10 may be electrically connected with one or more external components through the continuous surface in the first direction and the second direction.

Figure 1J:
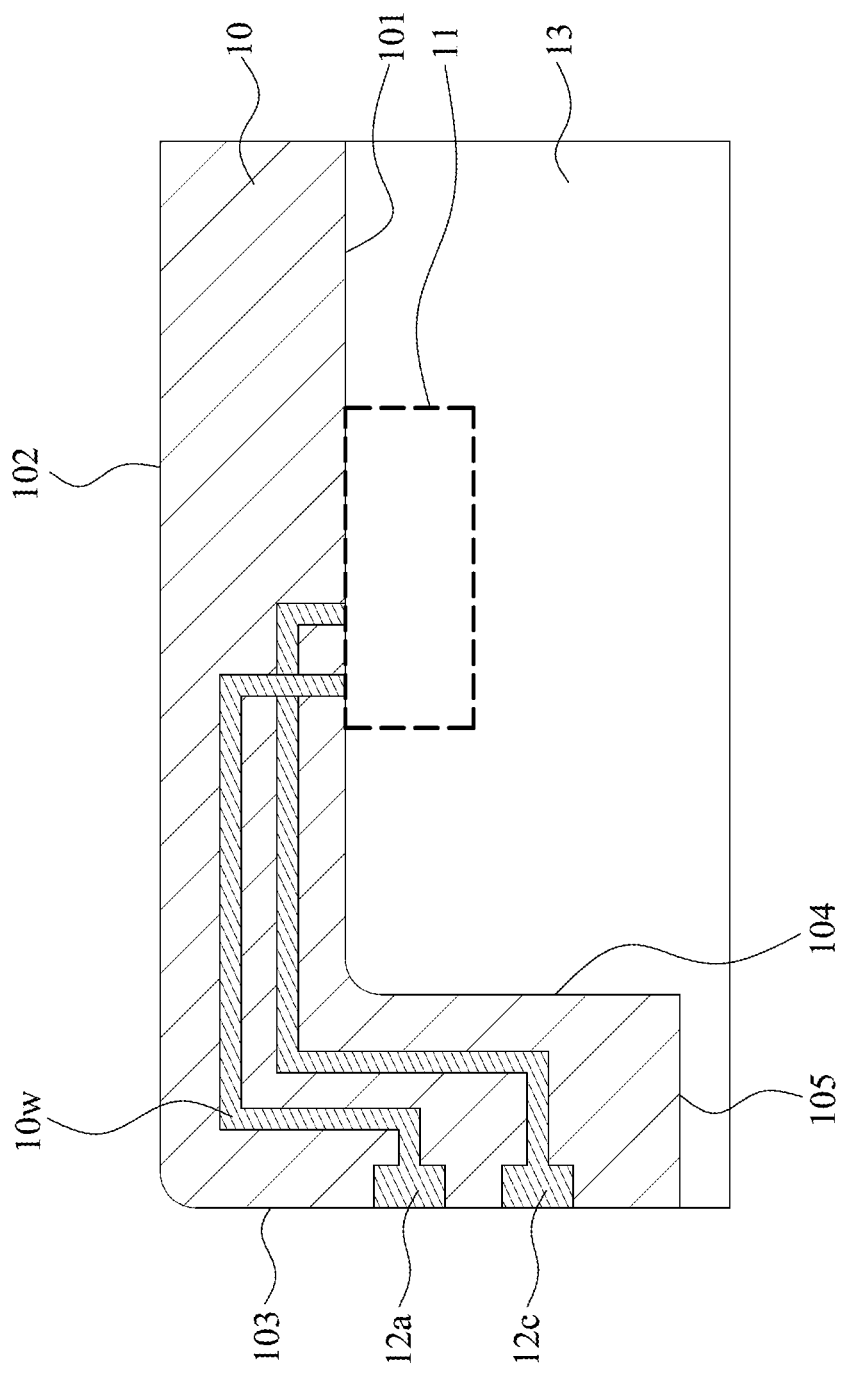
FIG. 1J is a cross-sectional view of a part of a semiconductor device package in accordance with some arrangements of the present disclosure.

FIG. 1J is a cross-sectional view of a part of a semiconductor device package in accordance with some arrangements of the present disclosure. The semiconductor device package in FIG. 1J is similar to the semiconductor device package in FIG. 1J and the similar or the same components are annotated with the same symbols. The surface 105 may be covered by the protection layer 13.

Figure 2A:
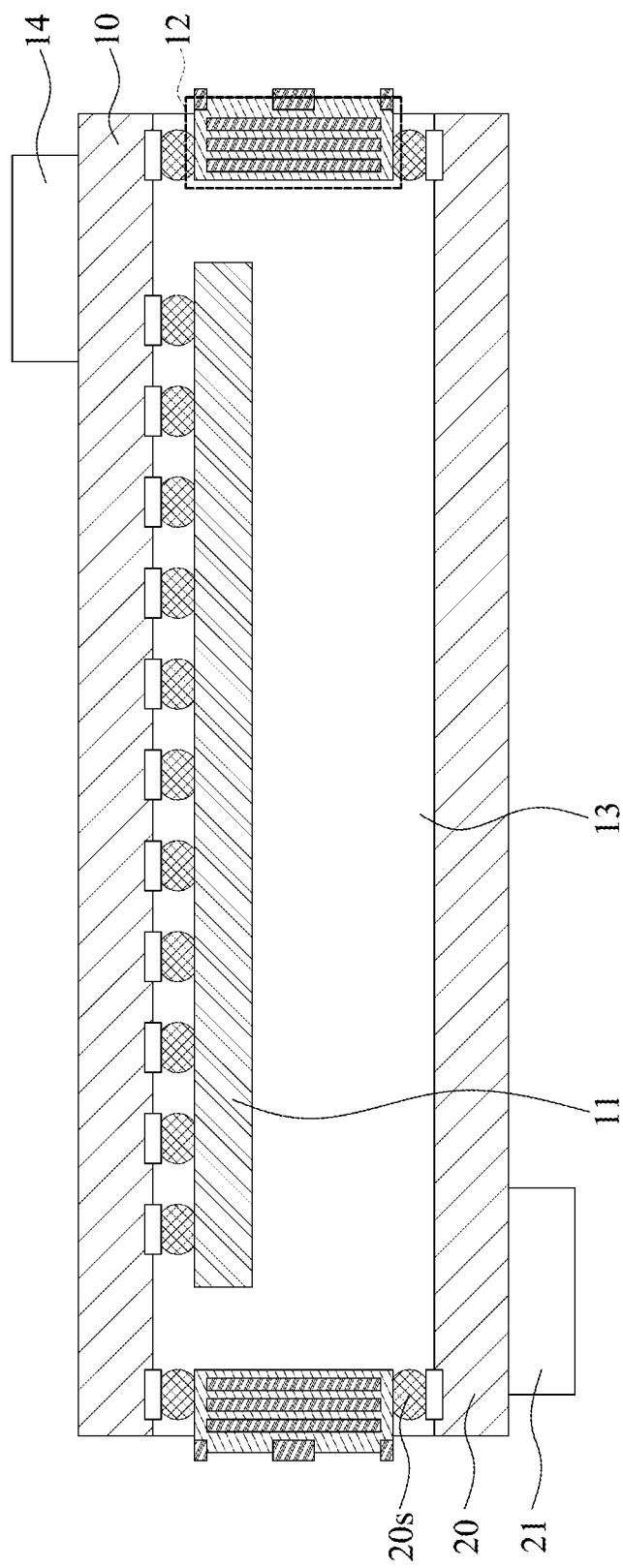
FIG. 2A is a cross-sectional view of a semiconductor device package in accordance with some arrangements of the present disclosure.

FIG. 2A is a cross-sectional view of a semiconductor device package 2 in accordance with some arrangements of the present disclosure. The semiconductor device package 2 is similar to the semiconductor device package 1 in FIG. 1A other than the differences described as follows.

The semiconductor device package 2 further includes a substrate 20 and a connecting module 21. The substrate 20 may be similar to the substrate 10. The connecting module 21 may be similar to the connecting module 14. The substrate 20 and the substrate 10 may be disposed on opposite sides of the protection layer 13. The interconnection structure 12 may be electrically connected to the substrate 20 by at least one connector 20s (e.g., two connectors 20s as shown), in addition to being electrically connected to the substrate 10 via at least one connector 20s (e.g., two connectors 20s as shown). The interconnection structure 12 may be disposed between the substrate 20 and the substrate 10. The interconnection structure 12 may be electrically connected between the substrate 20 and the substrate 10. In some arrangements, the substrate 20 may increase space for mounting the electronic devices or components. For example, in some arrangements, one or more electronic devices or components may be disposed on the substrate 20, such as on the same side as the connecting module 21 or on the opposite side. In some arrangements, the substrate 20 may increase space for arranging connecting module 21 to provide electrical interconnection or signal transmission along or parallel to the Z-axis.

Figure 2B:
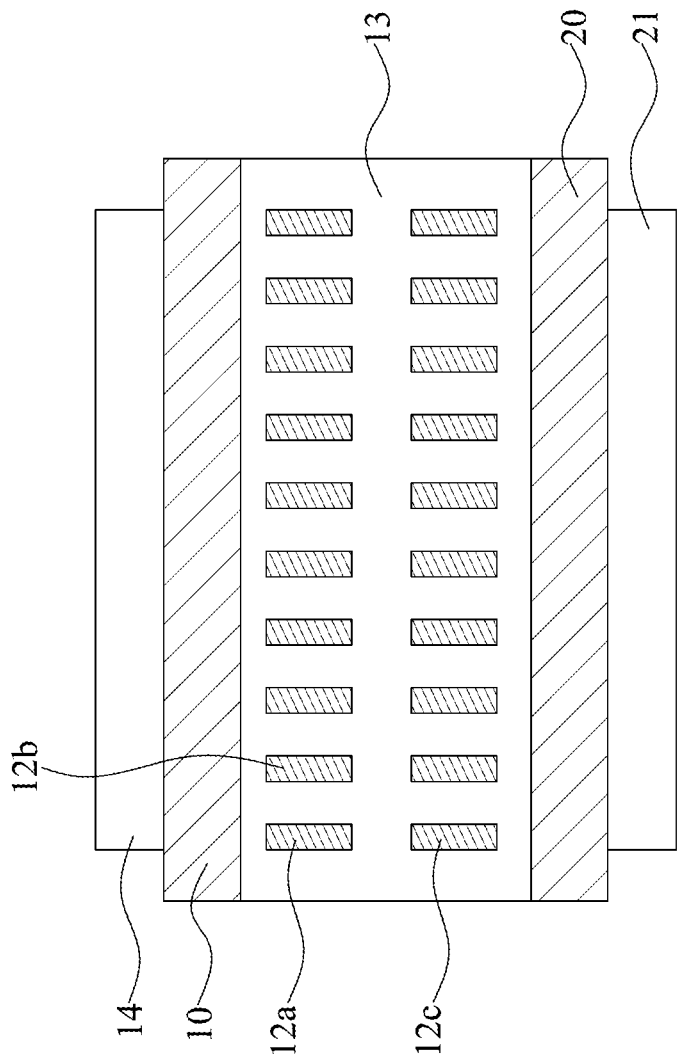
FIG. 2B is a cross-sectional view of a semiconductor device package in accordance with some arrangements of the present disclosure.

FIG. 2B is a cross-sectional view of a semiconductor device package in accordance with some arrangements of the present disclosure. In some arrangements, the semiconductor device package 2 in FIG. 2A may have a cross sectional view as shown in FIG. 2B.

One or more array of the conductive elements may be disposed on a lateral surface of the protection layer 13. As shown in FIG. 2B, two rows of conductive elements are disposed on a lateral surface of the protection layer 13. For example, the conductive elements can be arranged along two orientations, i.e., along or parallel to the Y and Z-axes. For example, the conductive element 12a and the conductive element 12b can be arranged along or parallel to the Y-axis. The conductive element 12a and the conductive element 12c can be arranged along or parallel to the Z-axis. As shown in FIG. 2B, each of the conductive elements has an elongated shape with a longitudinal dimension or length (e.g., the vertical dimension along or parallel to the Z-axis) and a latitudinal dimension or length (e.g., the horizontal dimension along or parallel to the Y-axis). The longitudinal dimension is greater than the latitudinal dimension.

Figure 3A:
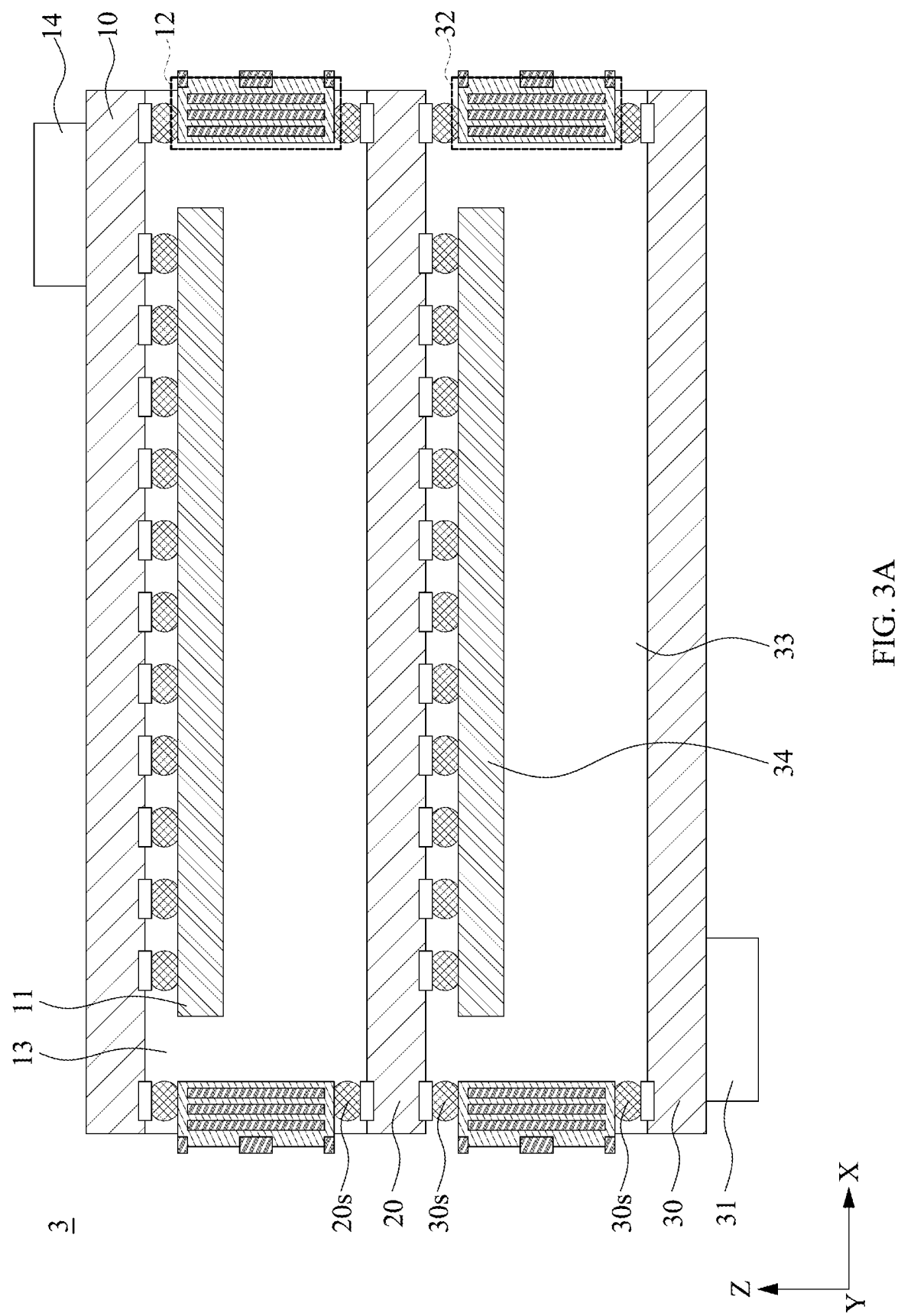
FIG. 3A is a cross-sectional view of a semiconductor device package in accordance with some arrangements of the present disclosure.

FIG. 3A is a cross-sectional view of a semiconductor device package 3 in accordance with some arrangements of the present disclosure. The semiconductor device package 3 may be similar to the semiconductor device packages 1 and 2 as shown in FIG. 1A and FIG. 2A. The electronic device 3 further includes a substrate 30, a connecting module 31, an interconnection structure 32, a protection layer 33, and an electronic device 34.

The electronic device 34 may be disposed on the substrate 20 and covered by the protection layer 33. The substrate 30 and the substrate 20 may be disposed on opposite sides of the protection layer 33. The interconnection structure 32 may be electrically connected to the substrate 30 by a connector 30s. The interconnection structure 32 may be disposed between the substrate 20 and the substrate 30. The interconnection structure 32 may be electrically connected between the substrate 20 and the substrate 30.

In some arrangements, the semiconductor device package 3 may include any number of semiconductor device packages 1 and 2 as shown in FIG. 1A and FIG. 2A based on design requirements.

Figure 3B:
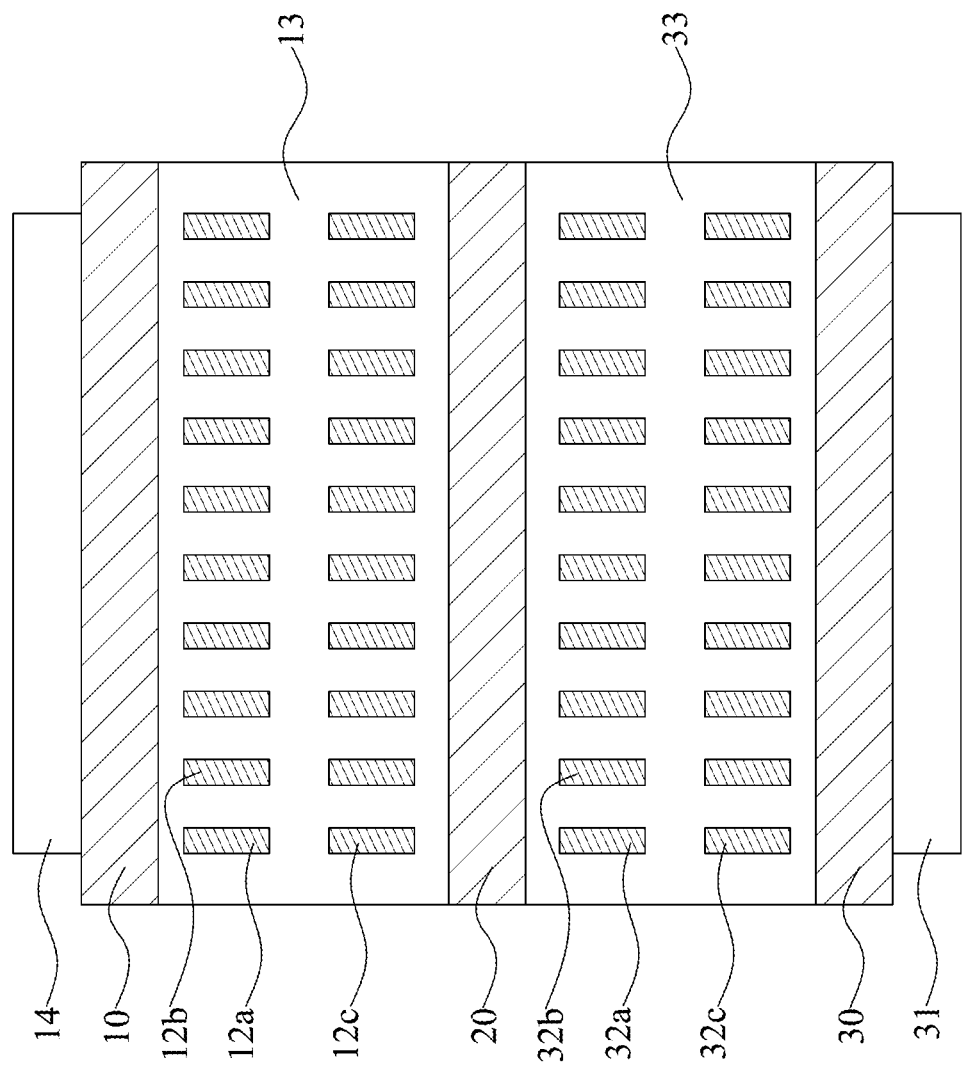
FIG. 3B is a cross-sectional view of a semiconductor device package in accordance with some arrangements of the present disclosure.

FIG. 3B is a cross-sectional view of a semiconductor device package in accordance with some arrangements of the present disclosure. In some arrangements, the semiconductor device package 3 in FIG. 3A may have a cross sectional view as shown in FIG. 3B.

As shown in FIG. 3B, two rows of conductive elements are disposed on a lateral surface of the protection layer 33. For example, the conductive elements can be arranged along two orientations, i.e., along or parallel to the Y and Z-axes. For example, the conductive element 32a and the conductive element 32b can be arranged along or parallel to the Y-axis. The conductive element 32a and the conductive element 32c can be arranged along or parallel to the Z-axis. As shown in FIG. 3B, each of the conductive elements has an elongated shape with a longitudinal dimension or length (e.g., the vertical dimension along or parallel to the Z-axis) and a latitudinal dimension or length (e.g., the horizontal dimension along or parallel to the Y-axis). The longitudinal dimension is greater than the latitudinal dimension.

Figure 4:
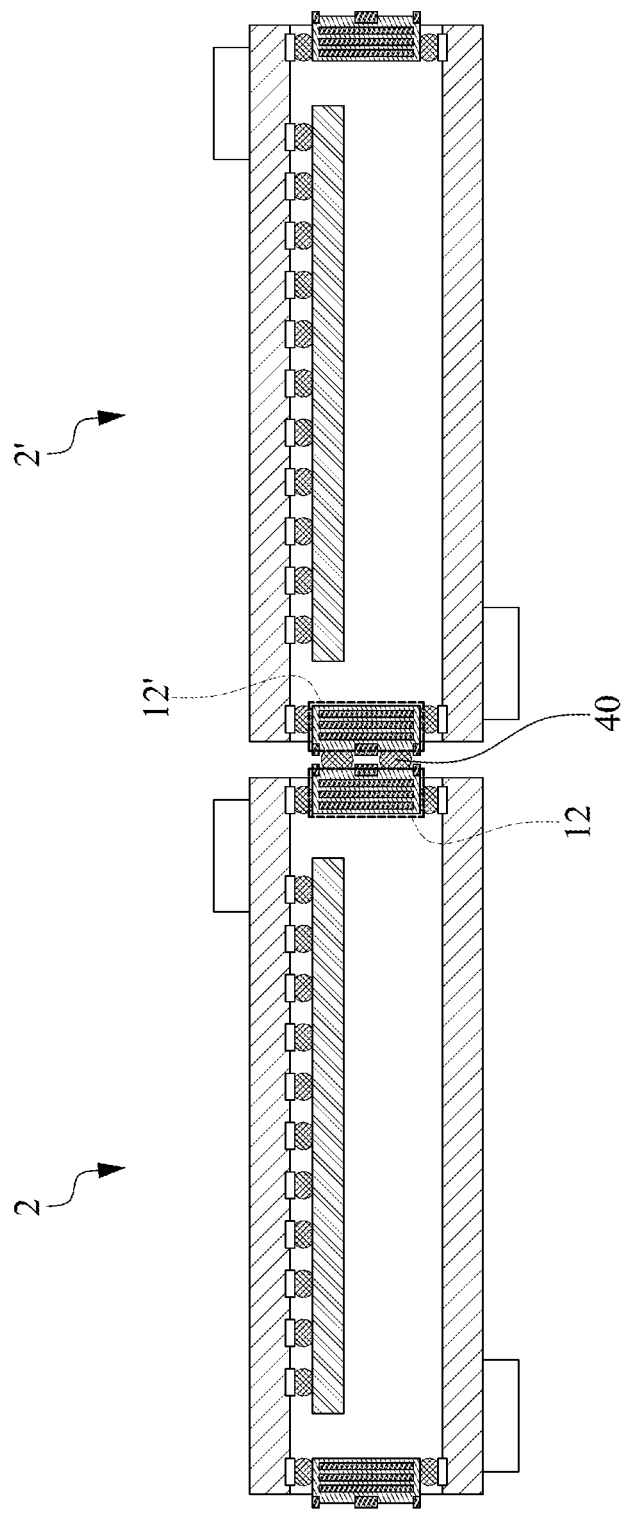
FIG. 4 is a cross-sectional view of two laterally connected semiconductor device packages in accordance with some arrangements of the present disclosure.

FIG. 4 is a cross-sectional view of two laterally connected semiconductor device packages 2 and 2' in accordance with some arrangements of the present disclosure. The semiconductor device package 2' may be similar to the semiconductor device package 2.

The semiconductor device package 2' may be disposed next to the semiconductor device package 2. The semiconductor device package 2' and the semiconductor device package 2 may be laterally connected. For example, the electronic signals between the semiconductor device package 2' and the semiconductor device package 2 may be transmitted via interconnection structure 12 and an interconnection structure 12' of the semiconductor device package 2'. The interconnection structure 12' may be similar to the interconnection structure 12.

In some arrangements, the interconnection structure 12' and the interconnection structure 12 may be electrically connected through a connection element 40. In some arrangements, the connection element 40 may include a soldering material, a conductive wire, an FPC (such as the FPC 50 as shown in FIG. 5), an interposer, or other bridging devices.

In some arrangements, the semiconductor device package 2' may be replaced by the semiconductor device package 1 in FIG. 1A, the semiconductor device package 3 in FIG. 3A, or other components or devices. In some arrangements, given the interconnection structure 12 may be provided on any surface to provide I/O pads or I/O pins, data can be transmitted between the semiconductor device package 2 and the semiconductor device package 2' through the interconnection structure 12. The signal transmission path may be along one orientation, and thus the signal transmission path and the conduction loss may be reduced. Moreover, the connection of the interconnection structure 12 of the present disclosure provides more flexibility when assembling the packages or devices. Packages or devices can be arranged on any location in a housing (such as the housing 80 in FIG. 8) to avoid signal interference without compromising package size.

Figure 5:
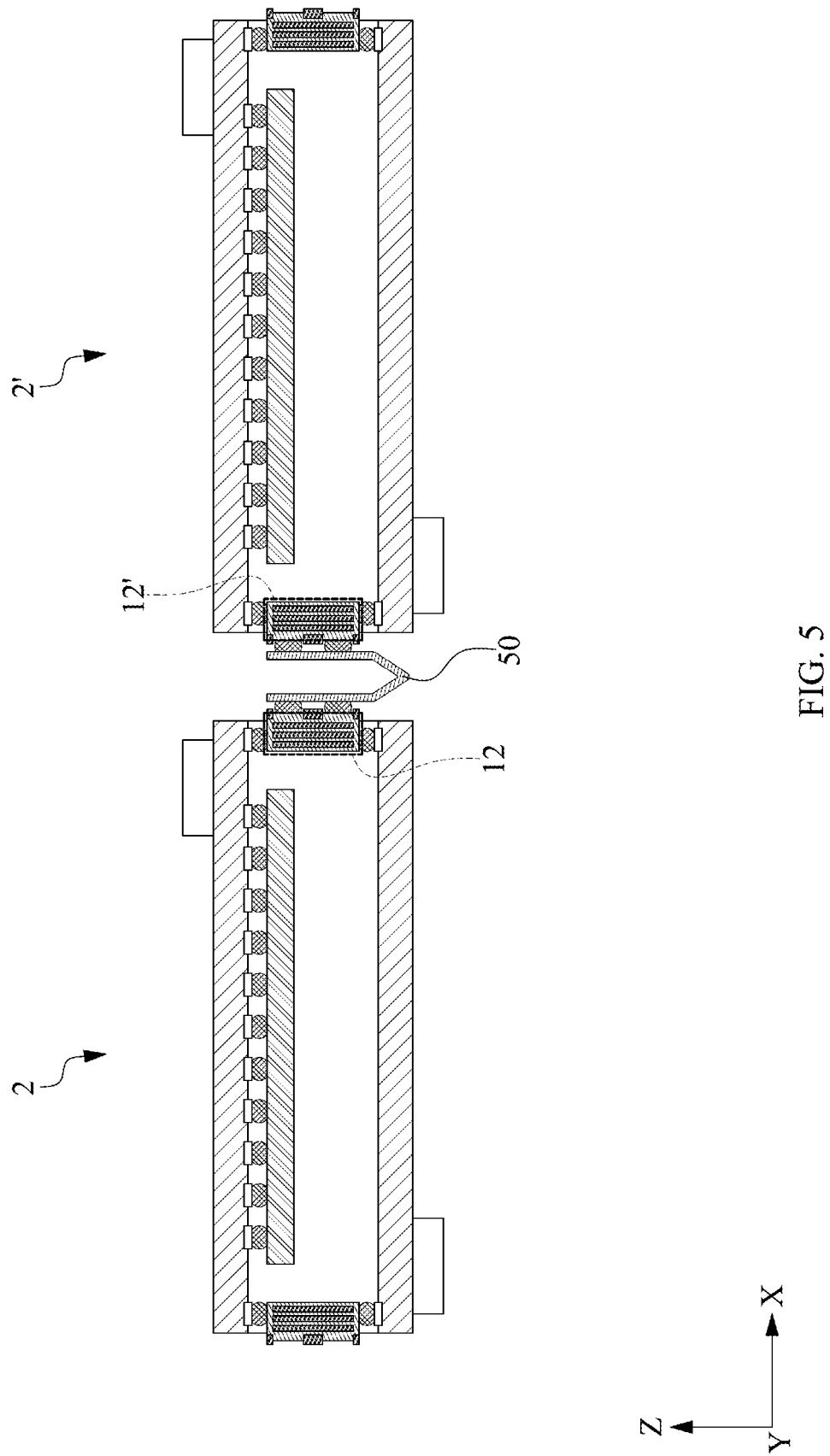
FIG. 5 is a cross-sectional view of two laterally connected semiconductor device packages in accordance with some arrangements of the present disclosure.

FIG. 5 is a cross-sectional view of two laterally connected semiconductor device packages 2 and 2' in accordance with some arrangements of the present disclosure. The configuration in FIG. 5 is similar to the configuration in FIG. 4, and will not be repeated hereafter.

Figure 6:
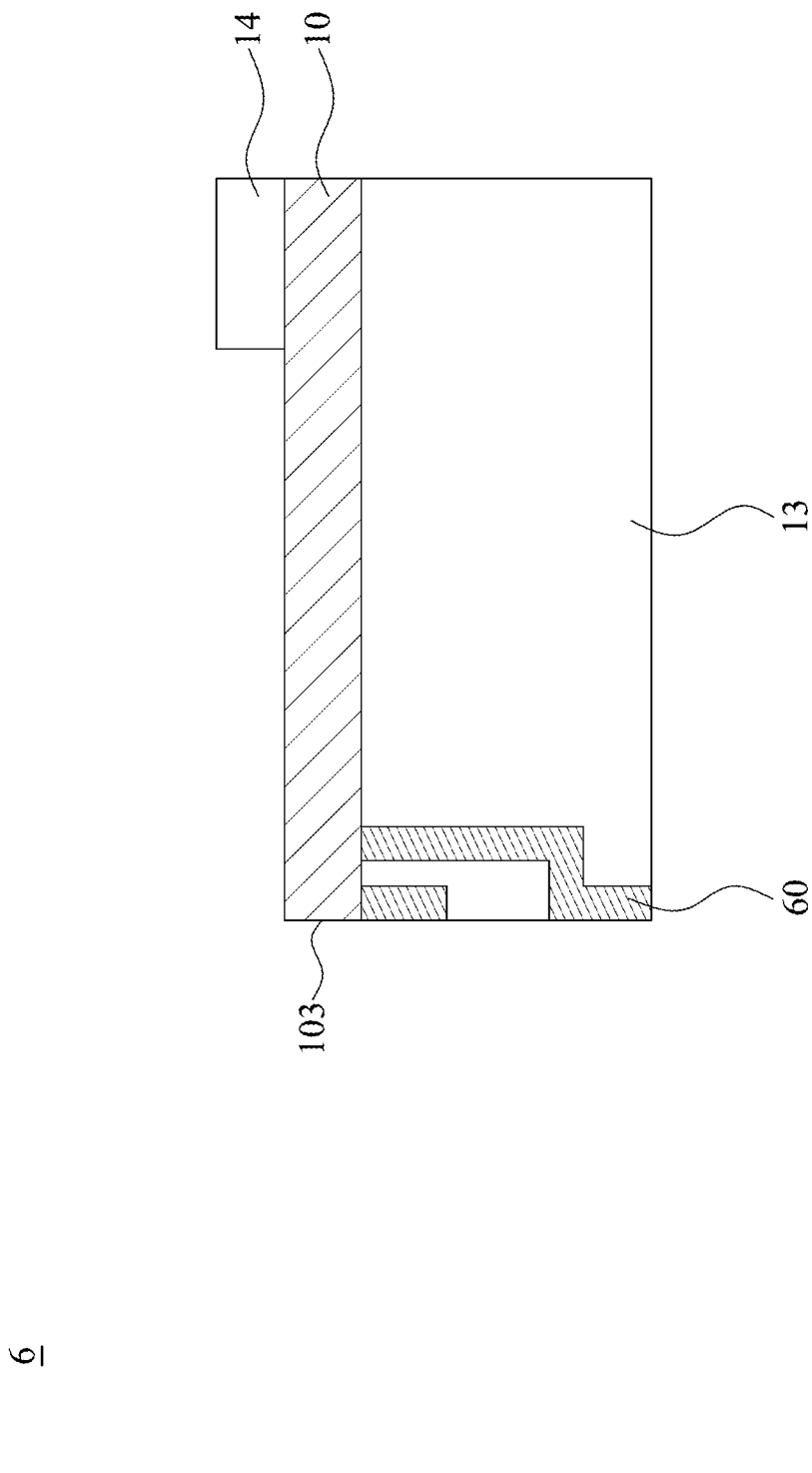
FIG. 6 is a cross-sectional view of a semiconductor device package in accordance with some arrangements of the present disclosure.

FIG. 6 is a cross-sectional view of a semiconductor device package 6 in accordance with some arrangements of the present disclosure. The semiconductor device package 6 is similar to the semiconductor device package 1 in FIG. 1A other than the differences described as follows.

The semiconductor device package 6 may include a metal frame 60 disposed adjacent to the lateral surface 103 of the substrate 10. In some arrangements, the metal frame 60 may be electrically connected to the substrate 10 by a connector, such as a solder bump, or other feasible conductive elements. The metal frame 60 may be configured to provide I/O pads or I/O pins for electrical interconnection or signal transmission between the semiconductor package device 1 and external components. In some arrangements, the metal frame 60 may have a cross sectional view as shown in FIGS. 1B-1F.

FIG. 7 is a perspective view of an electronic device 7 in accordance with some arrangements of the present disclosure. The electronic device 7 may include a semiconductor package device 70, electronic components 71, 72, 73, 74, and a housing 75. The semiconductor package device 70, and the electronic components 71, 72, 73, 74, may be accommodated in the housing 75.

In some arrangements, the electronic device 7 may include an earpiece as illustrated in FIG. 7. It should be noted that the application or usage of the semiconductor package device 70 as illustrated in the figures is for illustrative purposes only, and not intended to limit the present disclosure. The semiconductor package device 70 of the present disclosure can be used in combination with any wearable device or electronic device.

The semiconductor device package 70 may be similar to the semiconductor device package 1 in FIG. 1A, the semiconductor device package 2 in FIG. 2A, or the semiconductor device package 3 in FIG. 3A. In some arrangements, the semiconductor device package 70 may have a cross sectional view as shown in FIGS. 1B-1F.

In some arrangements, the component 71 may include a speaker. In some arrangements, the component 72 may include a battery. In some arrangements, the components 73 and 74 may be disposed adjacent to the housing 75. In some arrangements, the components 73 and 74 may include antennas, sensors (such as touch sensor, pressure sensor, temperature sensor, proximity sensor, or other.), light-emitting devices, microphones, and/or other components configured to function with the semiconductor device package 70. For example, the semiconductor device package 70 may include a feeding point corresponding to the antenna.

In some arrangements, the semiconductor device package 70 may have a surface 701 where electronic devices or components are configured to be mounted. The surface 701 may face an edge of the housing 75 and the other surfaces may not face the same edge of the housing 75. The semiconductor device package 70 may have an interconnection structure (such as the interconnection structure 12 in FIG. 1A) exposed from a surface other than the surface 701.

Figure 8:
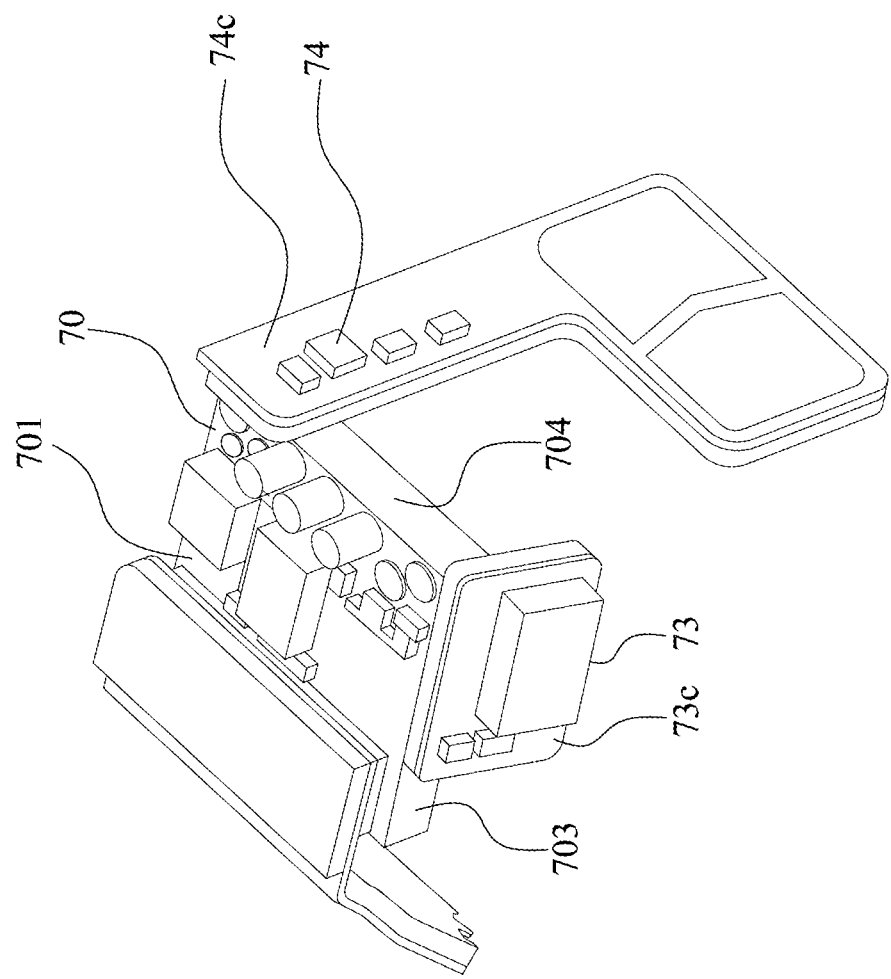
FIG. 8 is a perspective view of a part of an electronic apparatus in accordance with some arrangements of the present disclosure.

FIG. 8 is a perspective view of a part of the electronic device 8 in accordance with some arrangements of the present disclosure. The semiconductor device package 70 has a surface 703 and a surface 704. The surface 703 and the surface 704 are angled (e.g., non-parallel) with respect to the surface 701. The component 73 may be electrically connected with the surface 703 through a connection element (or a connector) 73c. The connection element 73c may be configured to adjust a relative location between the surface 703 and the component 73. For example, the component 73 may be disposed on any location of the connection element 73c, and the connection element 73c may be electrically connected to the surface 703. The component 74 may be electrically connected with the surface 704 through a connection element (or a connector) 74c. The connection element 74c may be configured to adjust a relative location between the surface 704 and the component 74. In some arrangements, the connection element 73c is closer to the surface 703 than to the surface 704. In some arrangements, the connection element 74c is closer to the surface 704 than to the surface 703.

Figure 11:
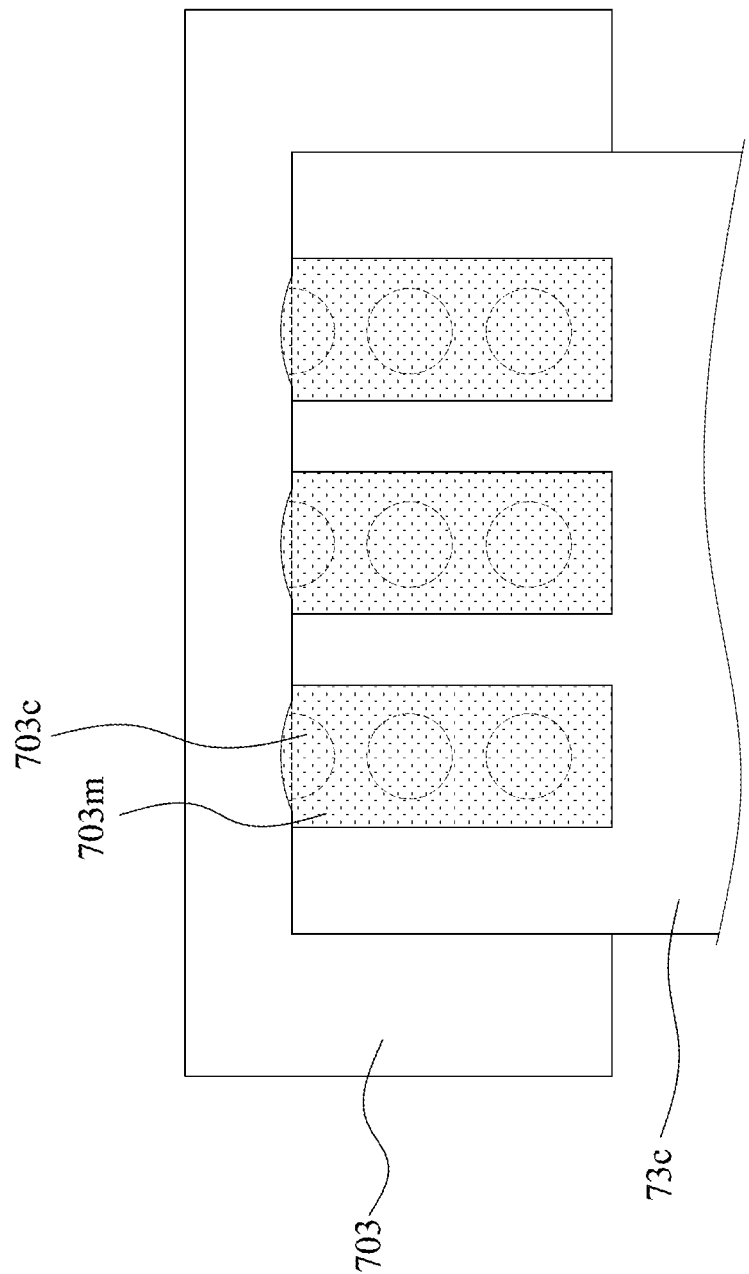
FIG. 11 is a perspective view of a part of an electronic apparatus in accordance with some arrangements of the present disclosure.

In some arrangements, the connection element 73c and the connection element 74c may include a soldering material, a conductive wire, an interposer, or other bridging devices. For example, as shown in FIG. 11, the connection element 73c is illustrated as a FPC in FIG. 11 and is soldered on the surface 703 through a soldering material 703m to connect to the conductive element 703c on the surface 703. In some arrangements, the connection element 73c and the connection element 74c may be not passing through the surface 701. In other words, the connection element 73c and the connection element 74c may not extend between the housing 75 in FIG. 7 and the surface 701. In some arrangements, the connection element 73c and the connection element 74c may be physically disconnected.

In some arrangements, the I/O pads or I/O pins of the semiconductor package device 70 may be adjusted according to the locations and functions of the component 73 and the component 74. The layout design flexibility of the semiconductor package device 70 can be increased, which would in turn improve the electrical performance and reliability of the electronic device 7 in FIG. 7. In addition, the size of the semiconductor package device 70 may be reduced, where more electronic devices can be incorporated into the electronic device 7. Furthermore, in some arrangements, reducing the semiconductor package device 70 may increase resonance and improve sound quality.

Figure 9:
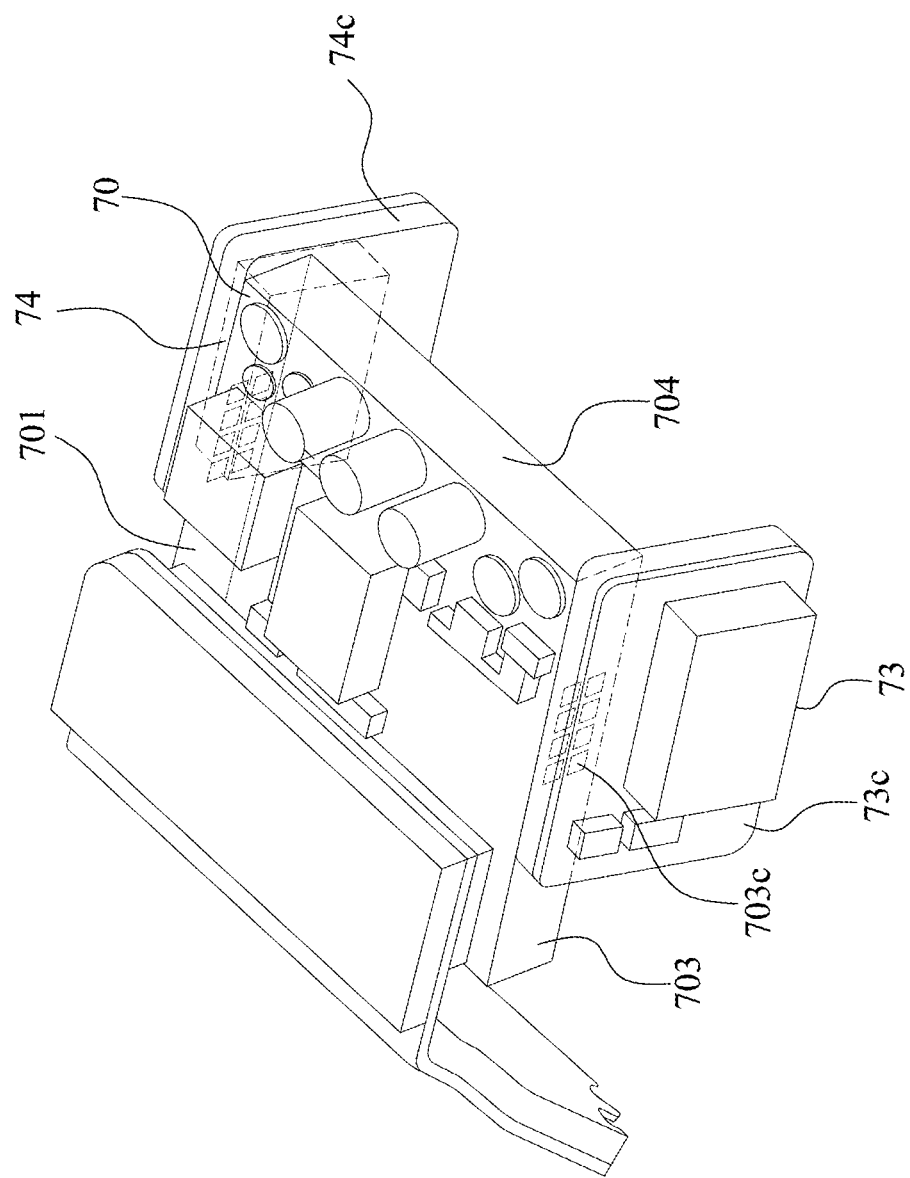
FIG. 9 is a perspective view of a part of an electronic apparatus in accordance with some arrangements of the present disclosure.

FIG. 9 is a perspective view of a part of an electronic apparatus 9 in accordance with some arrangements of the present disclosure. The electronic apparatus 9 is similar to the electronic apparatus 8 except that the connection element 73c and the connection element 74c are on opposite sides of the semiconductor device package 70. In addition, the conductive elements 703c exposed from the surface 703 are illustrated in FIG. 9.

Figure 10:
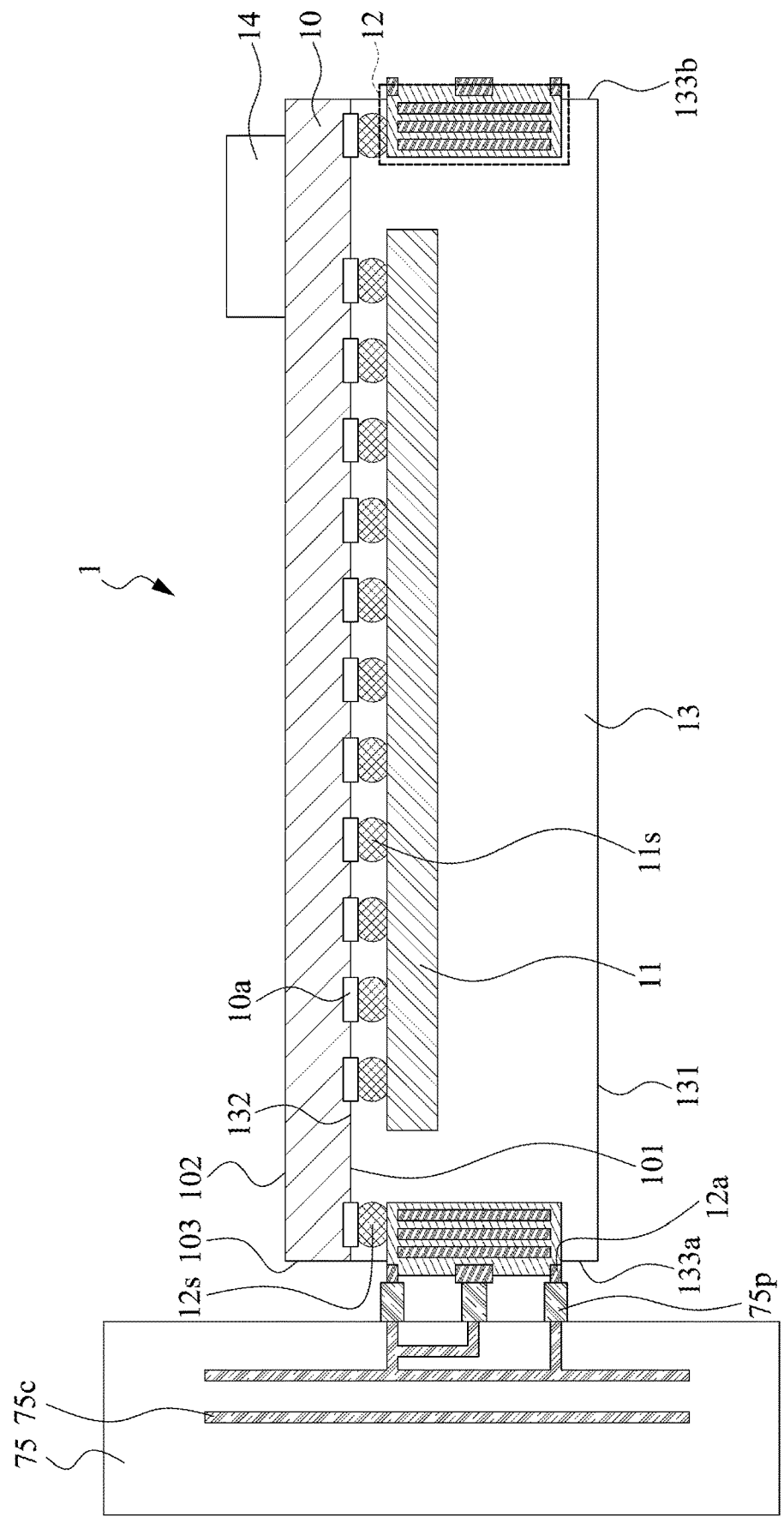
FIG. 10 is a cross-sectional view of a part of an electronic apparatus in accordance with some arrangements of the present disclosure.

FIG. 10 is a cross-section view of a part of an electronic apparatus in accordance with some arrangements of the present disclosure. The semiconductor device package 1 may have the conductive element 12a directly contacting an internal surface of a housing (such as the housing 75 in FIG. 7). For example, the conductive element 12a may be configured to be operably coupled or physically connect to a circuit 75c of the housing 75 through a connector 75p, which is connected to the circuit 75c. In some arrangements, the circuit 75c may be configured to provide communication (e.g., wireless communications) between the housing 75 and another device. In some arrangements, the circuit 75c may include an antenna. In some arrangements, the connector 75p may include a POGO pin. As shown in FIG. 10, when connected, the housing 75 (including the circuit 75c and the connector 75p) and semiconductor device package 1 are aligned or otherwise arranged along an axis parallel to the X-axis. In some examples, the connector 75p and the conductive element 12a are connected or mated with one another along the axis parallel to the X-axis. As shown in FIG. 10, when connected, the housing 75 has a housing surface 751 that faces a package surface (e.g., the surface 133a) of the semiconductor device package 1. The housing surface 751 may be angled (nonparallel) with respect to the surfaces 102 and/or 101.

FIG. 11 is a perspective view of a part of an electronic apparatus in accordance with some arrangements of the present disclosure. In some arrangements, the electronic device 8 in FIG. 8 may include a perspective view as shown in FIG. 11.

As shown in FIG. 11, as stated, the connection element 73c is soldered on the surface 703 through the soldering material 703m to connect to the conductive element 703c on the surface 703.

As used herein, the singular terms "a," "an," and "the" may include a plurality of referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity exceeding approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific arrangements thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other arrangements of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic apparatus, comprising:
   a substrate including a first surface, a second surface substantially parallel to the first surface, and a third surface extending between the first surface and the second surface;
   an interconnection structure disposed under the first surface of the substrate and physically separated from the substrate, wherein the interconnection structure is configured to be electrically connected with the substrate, and wherein the interconnection structure comprises a dielectric layer including a fourth surface exposing a plurality of conductive elements, a fifth surface substantially parallel to the fourth surface, a sixth surface, and a seventh surface substantially parallel to the sixth surface; and
   an encapsulant covering at least a portion of the first surface of the substrate and exposing the second surface and the third surface of the substrate.

2. The electronic apparatus of claim 1, wherein the plurality of conductive elements are array arranged.

3. The electronic apparatus of claim 2, wherein the plurality of conductive elements are arranged along at least two different directions.

4. The electronic apparatus of claim 1, wherein the fourth surface extends over the third surface to expose the plurality of conductive elements, wherein the substrate further comprises an eighth surface opposite to the third surface and non-parallel to the second surface.

5. The electronic apparatus of claim 1, wherein the dielectric layer of the interconnection structure further comprises a ninth surface extending from the fourth surface to the fifth surface and a tenth surface, wherein the tenth surface is closer to the first surface of the substrate than the ninth surface.

6. The electronic apparatus of claim 1, wherein the substrate comprises a plurality of conductive pads, wherein a density of the plurality of conductive pads is different from a density of the plurality of conductive elements.

7. The electronic apparatus of claim 6, wherein a dimension of a part of the plurality of conductive elements is greater than a dimension of the plurality of conductive pads.

8. The electronic apparatus of claim 1, further comprising:
   a component disposed over the second surface of the substrate and exposed from the encapsulant, wherein the component is configured to be electrically connected with an electronic component disposed under the first surface of the substrate through the substrate and is further configured to provide a signal transmission path for transmitting an analog signal, a digital signal, or both.

9. An electronic apparatus, comprising:
   a substrate including a first surface, a second surface substantially parallel to the first surface, and a third surface extending between the first surface and the second surface;
   an interconnection structure disposed under the first surface of the substrate and physically separated from the substrate, wherein the interconnection structure is configured to be electrically connected with the substrate; and
   an encapsulant covering at least a portion of the first surface of the substrate and exposing the second surface and the third surface of the substrate,
   wherein the interconnection structure comprises a dielectric layer including a fourth surface exposing a plurality of conductive elements, a fifth surface substantially parallel to the fourth surface, a sixth surface extending from the fourth surface to the fifth surface, and a seventh surface substantially parallel to the sixth surface, an eight surface extending from the fourth surface to the fifth surface and a ninth surface opposite to the eight surface, wherein the eight surface and the ninth surface are substantially perpendicular to the first surface of the substrate, and wherein the electronic apparatus further comprises a connected exposed from the ninth surface.

* * * * *